(12) United States Patent
Goldburt et al.

(10) Patent No.: US 11,044,353 B1
(45) Date of Patent: Jun. 22, 2021

(54) DEVICE FOR SUPPORTING A SMARTPHONE HAVING A VIDEO CAMERA OR FOR SUPPORTING A VIDEO CAMERA

(71) Applicants: Tim Goldburt, Elmsford, NY (US); Matt Sandy, Elmsford, NY (US)

(72) Inventors: Tim Goldburt, Elmsford, NY (US); Matt Sandy, Elmsford, NY (US)

( * ) Notice: Subject to any disclaimer, the term of this patent is extended or adjusted under 35 U.S.C. 154(b) by 0 days.

(21) Appl. No.: 17/038,551

(22) Filed: Sep. 30, 2020

Related U.S. Application Data

(63) Continuation-in-part of application No. 16/726,236, filed on Dec. 23, 2019, now abandoned.

(51) Int. Cl.
*H04N 5/225* (2006.01)
*H04M 1/02* (2006.01)
*G06F 1/16* (2006.01)
*H05K 5/02* (2006.01)
*H04R 3/04* (2006.01)

(52) U.S. Cl.
CPC .......... *H04M 1/026* (2013.01); *G06F 1/1632* (2013.01); *H04R 3/04* (2013.01); *H05K 5/023* (2013.01); *H05K 5/0204* (2013.01); *H04R 2430/01* (2013.01)

(58) Field of Classification Search
None
See application file for complete search history.

(56) References Cited

U.S. PATENT DOCUMENTS

| | | | | |
|---|---|---|---|---|
| 4,867,187 A | * | 9/1989 | Divine | A45B 3/00 135/16 |
| 5,449,012 A | * | 9/1995 | Friedman | A45B 3/00 135/16 |
| 2008/0118089 A1 | * | 5/2008 | Li | G09F 27/00 381/124 |
| 2009/0003822 A1 | * | 1/2009 | Tyner | F16M 13/04 396/428 |
| 2016/0290556 A1 | * | 10/2016 | Choi | F16M 13/00 |
| 2016/0306264 A1 | * | 10/2016 | Chu | G02B 26/08 |
| 2017/0064176 A1 | * | 3/2017 | Kim | F16M 11/041 |
| 2017/0192341 A1 | * | 7/2017 | Casarez | A45F 5/10 |
| 2017/0307136 A1 | * | 10/2017 | Wei | F16M 13/04 |
| 2017/0310868 A1 | * | 10/2017 | Wei | H04N 5/2328 |
| 2019/0162359 A1 | * | 5/2019 | Kundu | F16M 13/04 |

* cited by examiner

*Primary Examiner* — Twyler L Haskins
*Assistant Examiner* — Dwight Alex C Tejano

(57) ABSTRACT

A device for supporting a smartphone having a camera or supporting an action camera has a holder configured for supporting a smartphone having a camera or supporting an action camera, a handle configured to be held by a user, and components for receiving audio signals from an audio signal source and reproducing the received audio signals in the vicinity of the handle.

4 Claims, 20 Drawing Sheets

DEVICE FOR SUPPORTING A SMARTPHONE HAVING A VIDEO CAMERA OR FOR SUPPORTING A VIDEO CAMERA

CROSS-REFERENCE TO A RELATED PATENT APPLICATION

This patent application is a Continuation-in-Part of a previous patent application Ser. No. 16/726,236 filed on Dec. 23, 2019 and it claims its priority from the above-identified previous patent application.

BACKGROUND OF THE INVENTION

The present invention relates to devices for supporting a target object, in particular a smartphone having a camera in it and adjusting its position, for example the orientation, the panning movement, the rolling movement and the pitching movement, to achieve a stable and smooth shooting at multiple angles; or for supporting a video camera such as an action camera and adjusting its position, for example the orientation, the panning movement, the rolling movement and the pitching movement, to achieve a stable and smooth shooting at multiple angles.

There are various current supporting devices of this type—gimbals, stabilizers, telepods, tripods, self-recording sticks, etc. Current devices of this type, including gimbals and stabilizers for smartphones or action cameras, are designed to function so that when they support a smartphone with a video camera or when they support an action video camera they provide smooth video shooting and various methods of video recording, including, but not limited to, motion time lapse, stable vertical video shooting for a social media vertical video format, and added software app functions such as facial and object tracking. However, the current video camera support devices, such as gimbals, stabilizers and cameras with built-in gimbals, do not have any capability for receiving in the devices audio signals from an inside or outside audio source and reproducing the audio signals in the vicinity of the device and therefore in the vicinity of a supported smartphone with a video camera or an action video camera during recording by a smartphone video camera or an action video camera.

SUMMARY OF THE INVENTION

Accordingly it is an object of the present invention to provide a supporting device for supporting a target object, in particular for supporting a smartphone having a video camera or for supporting an action video camera, and adjusting its position to achieve a stable and smooth shooting, which avoids the disadvantages of the prior art devices by allowing a user to record a finished video with an accompanying audio received from an inside or outside source and played back from the device itself in real time during video recording, in order to save the user time so that the user does not need to later spend time to post-edit the video in order to add an accompanying audio track to it.

In the present invention the device has means provided for receiving audio signals from an inside or an outside audio signal source and reproducing the received audio signals in the handle during video recording by the camera. The user can therefore simultaneously perform a video recording with the supported smartphone having a video camera or action video camera along with the audio signals received from an inside or an outside source directly in the device simultaneously, in order to create a completed video recording with the audio, so that the user does not have to later perform post editing or post production to combine the audio with the video. The user can therefore match the audio and the video recording together in real time to perfectly combine the accompanying audio to the video scene according to the user's taste and choice. The audio signals which are received from the inside can be from the internal digital data memory storage located inside the handle for receiving and internally storing audio signals as digital data. The audio signals which are received from the outside audio sources in the present invention can be radio signals which are received from outside radio sources. Additionally, they could be from a prerecorded audio track. The video recording and the reproducing of the audio signals can be activated and actuated together at the same time using a control interface for both audio and video controls, and therefore the video recorded by the camera includes the received and reproduced audio signals, thus providing for new and highly advantageous results. For example, post-editing is therefore not required to combine video and audio tracks into one file, eliminating the time consuming video recording file editing process.

In keeping with these objectives and with others which will become apparent hereinafter, one feature of the present invention resides, briefly stated in a device for supporting a smartphone having a video camera in it or for supporting an action video camera, which has a support configured for supporting a smartphone with a camera or for supporting an action camera, a handle configured to be held by a user, and means for receiving audio signals from an audio signal source and reproducing the received audio signals in the vicinity of the handle.

When the device for supporting a smartphone having a video camera or an action video camera is designed in accordance with the present invention, it not only supports the target object, in particular the smartphone having a video camera in it or an action video camera, and adjusts its position to achieve a stable and smooth shooting, but at the same time it allows to receive audio signals from audio sources and to reproduce them in the vicinity of the handle and also in the vicinity of a supported smartphone having a video camera or action camera during video recording so that the video recording of the smartphone video camera or of the action video camera includes the reproduced audio signals from the device. This allows for concomitant recording into one file combining video and audio signals into the resulting file ready for immediate use, such as for social media sharing and other internet applications.

According to a further feature of the present invention the device for supporting a smartphone having a video camera or an action video camera of the invention further has at least two motors arranged between the handle and the holder and operative for moving the holder and thereby the smartphone having a camera camera, or for moving the action video camera supported by the holder relative to the handle, for stabilizing the position of the smartphone, or the position of the action camera, for a stable and smooth movement recording at multiple angles. The movement of the holder and the operation of the motors can be powered up with a power control separately and independently from the powering up of the audio reproducing means.

According to a further feature of the present invention the device for supporting a smartphone having a video camera in it or for supporting an action video camera of the invention further has internal digital data memory located inside the handle for receiving and internally storing audio signals as digital audio data, and an audio speaker provided in the handle reproducing the internal audio signals in the vicinity of the handle, which can be powered up separately by the user with the volume control means. The device for supporting a smartphone having a video camera in it or for supporting an action video camera of the invention also can have the means for selecting an outside audio signal source for receiving the audio signals from the selected outside audio signal source and reproducing the received audio signal in the vicinity of the handle, which can be powered up separately by the user with the volume control means.

A further feature of the present invention resides in the device for supporting a smartphone with a video camera or an action camera, in which the user can power up or down the audio signals reproduced in the speaker with the volume control buttons. The audio signal powering up or down with the volume control buttons is separate from the powering up or down of the video control and of the movement of the holder. This allows to conserve the power management of the device and to also separately engage and start the reproduced audio signals so that the user can first search for the perfect music or audio signals in order to match the environment and scene the user is in for live video recording. For the supporting device that includes a gimbal function and motors, the user can separately power on the gimbal function and motors to engage the video recording control means in order to capture the video recorded with the supported smartphone having a video camera in it or with the action video camera by the device with the receiving audio signals. The user can therefore match the audio reproduced by the device and the video recording of the smartphone video camera or the action video camera supported by the device together in real time to perfectly combine the accompanying audio to the live video scene.

This action of combining the reproduced audio from the device with the video recording of the supported smartphone with the video camera or of the action camera can also be activated and actuated at the same time. This is done by starting the recording by the smartphone video camera with the video recording button on the device at the same time as the user powers up the volume of the reproduced audio signals with the volume control buttons or speaker volume knob. Then the video recording can be stopped at the same time with the reproduced audio signals using the audio and video controls which are all positioned on the device in the combined user interface for ease of use. This way the user's finished video recording combines and includes both the video recorded by the user and the audio selected by the user and reproduced by the device so that the user does not require post-editing of the audio in the video recorded. The advantage of this construction and its corresponding operation is that the post editing time is no longer needed by the user.

A further feature of the present invention resides in that in the device for supporting a smartphone with a video camera or an action video camera the user can activate and power up first and then adjust with a speaker control knob the volume of the speaker reproducing the audio signals from the device. This audio signal powering up or down with the speaker control knob is separate from the powering up or down of the video control and of the movement of the holder. In so doing, the audio signals reproduced by the speaker can be first played to match the intent of the video recording. For the supporting device that includes a gimbal function and motors, the user can separately power on the gimbal function and the motors to engage the video recording control means and activate the video recording so that the video recorded by the smartphone video camera or action video camera includes the reproduced audio signals from the device. This can also be activated within the same time by the user so that the start of the smartphone video recording can be activated with the video recording button at the same time as powering up the speaker reproducing the audio signals with the speaker control knob. The video recording can then be stopped at the same time with the reproduced audio signals by the user with the combined user interface with the audio and video controls. The user's finished video recording produced with the device combines both the video recorded by the user and the audio selected by the user and reproduced by the device in real time. The user can therefore produce a finished video recording with both the video and audio the user desires together in real time and not need any post-editing time later to add the desired audio to the video.

Still a further feature of the present invention resides in that the device for supporting a smartphone with a video camera or for supporting an action video camera further has means for adjusting the volume of the reproducing of the received audio signals from the selected outside audio signal source in the vicinity of the holder. This is accomplished with volume control buttons and/or the speaker volume control knob. For example, the user can first adjust the audio signal volume from the receiving audio signals, prior to then adjusting the outputted speaker volume of the reproducing audio signals so that the video recording receives the optimally adjusted audio signals. A good audio quality is critical for the live video recording, especially in an outdoors environment where the noise is higher and the audio signal should be clean and boosted to overcome the outside noise. With respect to volume amplification, with two sets of volume controls, the overall volume and audio quality can be outputted stronger and cleaner as opposed to one volume control method. If one volume control method can be adjusted on a hypothetical scale of 1 to 10, the audio signal may be distorted at a higher setting. With the two volume controls, the volume amplification range can be extended beyond the hypothetical scale to 11 and greater, and the audio signal itself can be preserved cleanly. The volume control buttons would be a first set of controls for the adjustment of the volume from the input, and the speaker volume control knob would control the volume amplification additionally for the user to achieve a good audio quality for the video recording. This is also especially important as well to overcome negative issues of audio signal distortion, noise, crackles, etc. that are made more prevalent if the user is limited to one set of volume control, as opposed to two sets of volume control.

A further feature of the present invention resides in that the device has a screen display for showing the corresponding digital audio data or the wavelengths of the audio signals, a knob for switching between AM radio waves and FM radio waves of the audio signals, and knobs for dialing a corresponding wavelength within an AM and FM ranges of the audio signals.

A further feature of the present invention resides in that in the device the means can include an AM receiver, an FM receiver, an AM transmitter, an FM transmitter, and a speaker. Also, it can include an antenna for transmitting and receiving radio signals, a receiver circuitry and a transmitter circuitry both connected to a processor circuitry, and a control processor which controls the operation of these components, a microphone, a keypad, and a display.

A further feature of the present invention resides in that the device can receive audio inputs from a USB flash drive for inserting the USB flash drive with a digital mp3 music files playlist, and the device can receive alphanumeric or other inputs from a keypad interface with visual outputs through a display so that the user can load into and play with the device pre-recorded audio tracks.

A further feature of the present invention resides in that the device has internal digital data memory storage located inside the handle for receiving and internally storing audio signals as digital audio data and an audio speaker provided in the handle for reproducing the internal audio signals in the vicinity of the handle during the recording of the video by the camera or the action camera, and the device can receive alphanumeric or other inputs from a keypad interface with visual outputs through a display so that the user can load and play with the device the internally digitally stored audio tracks.

A further feature of the present invention resides in that it includes a gimbal function and motors, and the handle is provided with an on/off power button for turning the operation of the gimbal and thereby the movement of the holder on or off, a joystick button for controlling the movement of the smartphone having a video camera or the action video camera, an orientation button for orienting the smartphone with the camera or orienting the action camera, a button for operating corresponding modes, and a button for video recording of the smartphone having a video camera that can be connected via bluetooth to wirelessly control the smartphone video camera recording.

A further feature of the present invention resides in that in that the handle is provided with an opening for attaching the device to a support and having an inner thread for screwing in a threaded end of the support, and the opening is provided in a part connectable with a remaining part of the handle by a threaded connection.

A further feature of the present invention resides in that the device has a part with a threaded portion provided with an outer thread and screwable into a lower part of the handle which is hollow and provided with an inner thread, and the handle has an inner opening which is exposed when the part is unscrewed and removed from a remaining part of the handle and which is exposed for inserting of a battery.

A further feature of the present invention resides in that in the device the handle is connected with remaining components of the device via a multi-part telescoping connecting unit composed of a plurality of handle elements which are telescopingly connectable with one another and are displaceable relative to one another, so that by extending or retracting of the telescoping connecting unit the distance of the holder from the handle can be reduced or increased. This allows for a highly advantageous result for the user extending the reach of the video recording, for example for self-video recording, as well as for allowing a wider field of view angle for the video recording.

A further feature of the present invention resides in that the device has a tilt axis motor and a roll axis motor applying correspondingly a tilting movement and a rolling movement to the movement of the holder, and a foldable arm having one end connected with the tilting motor and another opposite end pivotable connected with the pan axis motor so that the device can be folded to occupy a substantially small space, which can be convenient for its storage and transportation.

A further feature of the present invention resides in that in the device has a multi-part telescoping connecting unit composed of a plurality of elements which are telescopingly connectable with one another and are displaceable relative to one another and connecting the handle with the pan axis motor so that by extending or retracting of the telescoping connecting unit the distance of the holder to the handle can be reduced or increased. In addition, it can also have a foldable arm with one end connected with the tilt axis motor and another opposite end pivotable connected with the pan axis motor, so that the device can be folded so as to occupy a substantially small space which can be convenient for its storage and transportation, while retaining the previously mentioned advantages allowing the user to extend the reach of the video recording, for example for self-video recording, as well as for allowing a wider field of view angle for the video recording.

A further feature of the present invention resides in that the handle has a substantially rectangular cross section and an additional portion provided with components which allow receiving audio signals from audio sources and reproducing them in the vicinity of the handle and therefore also in the vicinity of a supported smartphone with a video camera or of a supported action video camera during recording by the camera so that the video recording of the smartphone video camera or of the action video camera includes the reproduced audio signals from the device.

A further feature of the present invention resides in that in the device the holder includes a housing which has an additional portion provided with components which allow receiving audio signals from audio sources and reproducing them in the vicinity of the handle and therefore in the vicinity of a supported smartphone with a video camera or of a supported action camera during recording by the camera so that the video recording of the smartphone video camera or of the action video camera includes the reproduced audio signals from the device. The housing is supported on a tripod with adjustable legs and connected with the housing via a ball joint and fixed by a screw in its desired position. The device can further support a gimbal on its tripod with adjustable legs, by connecting the gimbal with an insert thread in its base to the housing via a ball joint and fixed by a screw in its desired position.

A further feature of the present invention resides in that the handle has an on/off power button for turning the operation of the device on or off, a joystick button for controlling the movement of the smartphone video camera or the action video camera, an orientation button for orienting the smartphone or the action camera, a button for operating corresponding modes, and a button for video recording that can be connected via bluetooth to wirelessly control the smartphone video camera recording, and the handle is connected with a telescoping extension support that can be controlled by a user and is composed of interconnected components that are moveable toward one another and away from one another to reduce or to increase the length of the support, for convenience of the user's operation with the smartphone with a video camera or with an action camera received in the holder.

A further feature of the present invention resides in that in the device the handle is telescoping and has a plurality of individual portions telescopingly connected with each other to increase or reduce the length of the handle, with the individual portion that is the closest to the holder having an element which is turnably connected with an element supporting the holder.

A further feature of the present invention resides in that in the device has a video camera with a lens objective and a viewfinder display, and the handle is formed as a casing with a portion provided with the components which allow receiving audio signals from audio sources and reproducing them in the vicinity of the device during video recording by the supported camera so that the video recording of the video camera includes the reproduced audio signals from the device.

A further feature of the present invention resides in that the handle has a portion provided with components which allow receiving audio signals from audio sources and reproducing them in the vicinity of the device and designed for supporting of the camera which is a large camera.

A further feature of the present invention resides in that the device is formed as a pocket-size device with a casing which forms the handle, a viewfinder with a touch screen and a lens objective, a roll axis motor, a tilt axis motor, and pan axis motor for imparting corresponding movements to an objective lens of the camera, and the casing has a portion provided with the components which allow receiving audio signals from audio sources and reproducing them in the vicinity of the device so that the video recording of the camera includes the reproduced audio signals from the device, and a lower portion with a thread for connecting to a support.

The novel features of the present invention are set forth in particular in the appended claims. The invention itself however will be best understood from the following description of the preferred embodiments, which is accompanied by the following drawings.

BRIEF DESCRIPTION OF THE DRAWINGS

FIG. 1a-16 are views showing details and different embodiments of the device for supporting a smartphone having a camera or an action camera according to the present invention.

DESCRIPTION OF THE PREFERRED EMBODIMENTS

Figure 1:
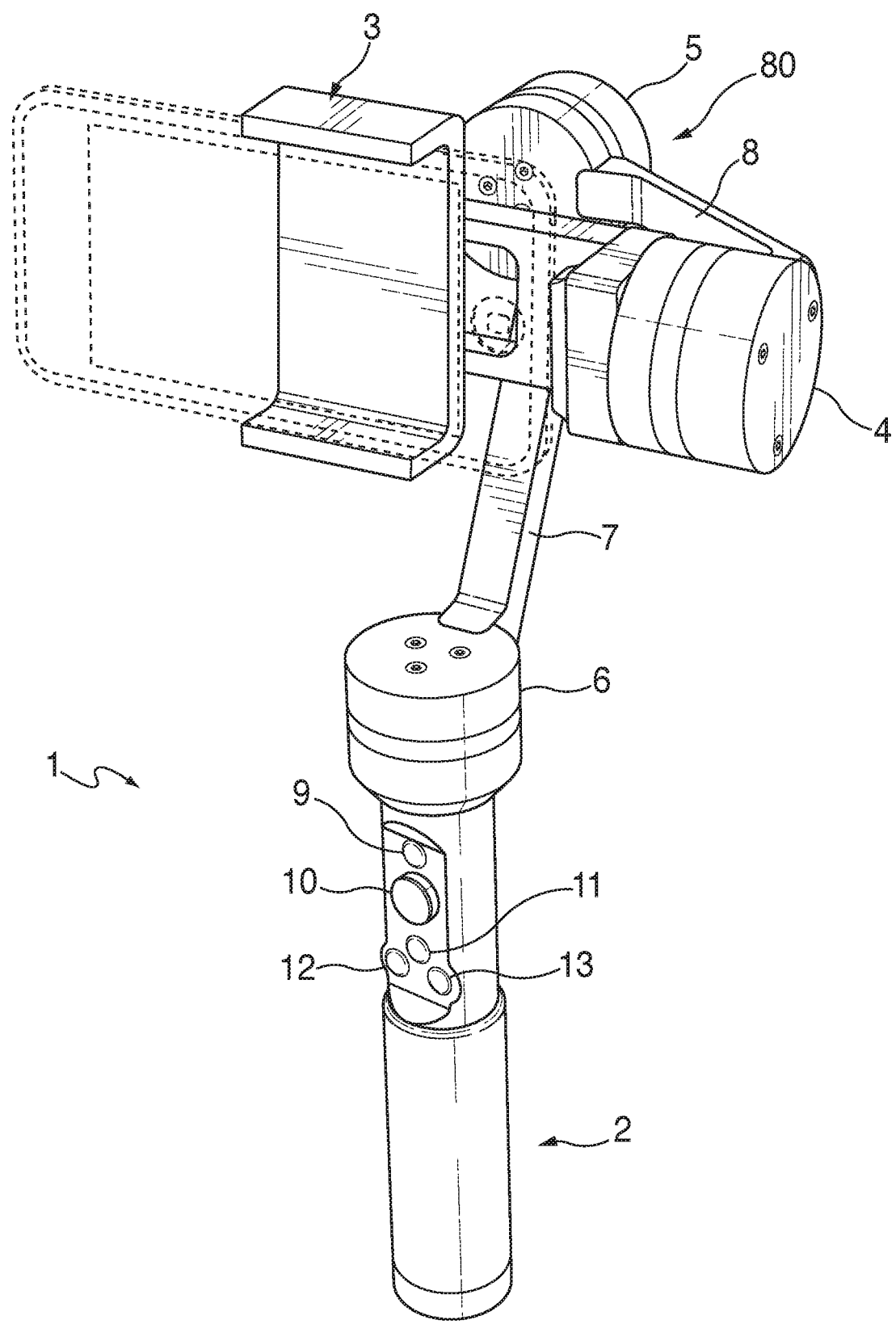
FIG. 1 is a view showing a known device for supporting a smartphone having a camera or an action camera.

FIG. 1 of the drawings shows a perspective view of a known device 1 for supporting a smartphone having a video camera or an action video camera. The supporting device 1 has a handle 2 adapted to be held by a user and connected with a holder 3 for receiving and holding a not shown smartphone with a video camera or holding an action video camera. It further has a gimbal 80 with a tilt axis motor 4, a roll axis motor 5, and pan axis motor 6 for imparting corresponding movements to the holder 3 and thereby to a smartphone with a video camera or an action video camera held in the holder 3. Arms 7 and 8 connect the corresponding motors with one another.

The handle 2 is provided with an on/off power button 9 for turning the operation of the motors 4, 5 and 6 as well as the video recording controls on or off of the device, a joystick button 10 for controlling a video recording and the movement of the video camera of the smartphone or the action video camera, an orientation button 11 for orienting the smartphone with the video camera or the action video camera, a button 12 for operating corresponding modes, and a button 13 for video camera activation and recording.

Figure 1A:
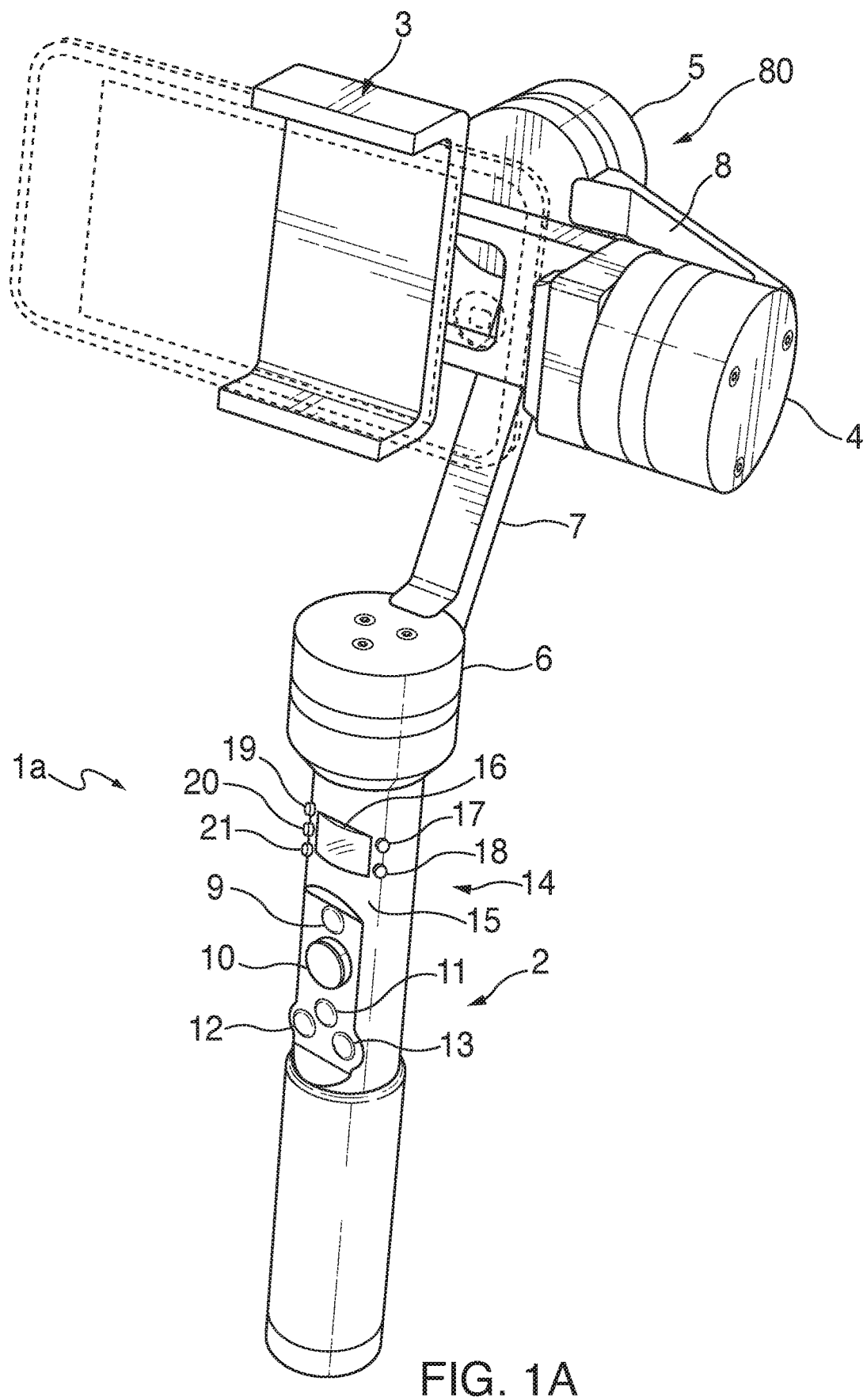

FIG. 1A shows a gimbal device 1a designed in accordance with the present invention. It corresponds to the known device in that it can be provided with some or all above described components of device 1. The device according to the invention further has novel components and operates in a novel manner, which will now be described in detail.

In the gimbal device 1a for supporting a smartphone having a camera that provides for recording video or supporting an action video camera that provides for recording video, the handle 2 has an additional portion which is identified with reference numeral 14. This portion is provided with components 15 allowing to receive in the device 1a audio signals from an audio source, in order to reproduce these audio signals in the vicinity of the holder and grip of the device 1a so that therefore during video recording with the supported smartphone video camera or the action video camera, the video recording can include the reproduced audio signals from the device in real time.

The device 1a has a screen display 16 for showing the digital audio data or the wavelengths of the radio audio signals. The device 1a has an audio signal power up and a volume adjustment button 17 and an audio signal powering down and a volume adjusting down button 18 for adjusting the volume of received audio signals up or down correspondingly and for powering on or off the audio signals reproduced in the speaker. The device 1a has a knob 19 for switching between AM radio waves and FM radio waves, and a knob 20 for dialing a corresponding wavelength within an AM and FM ranges. The device 1a also includes an additional component knob 21 that powers up or powers down the power of the speaker that reproduces the corresponding audio signals and adjusts up or adjusts down the volume of the speaker which reproduces the corresponding audio signals.

Figure 1B:
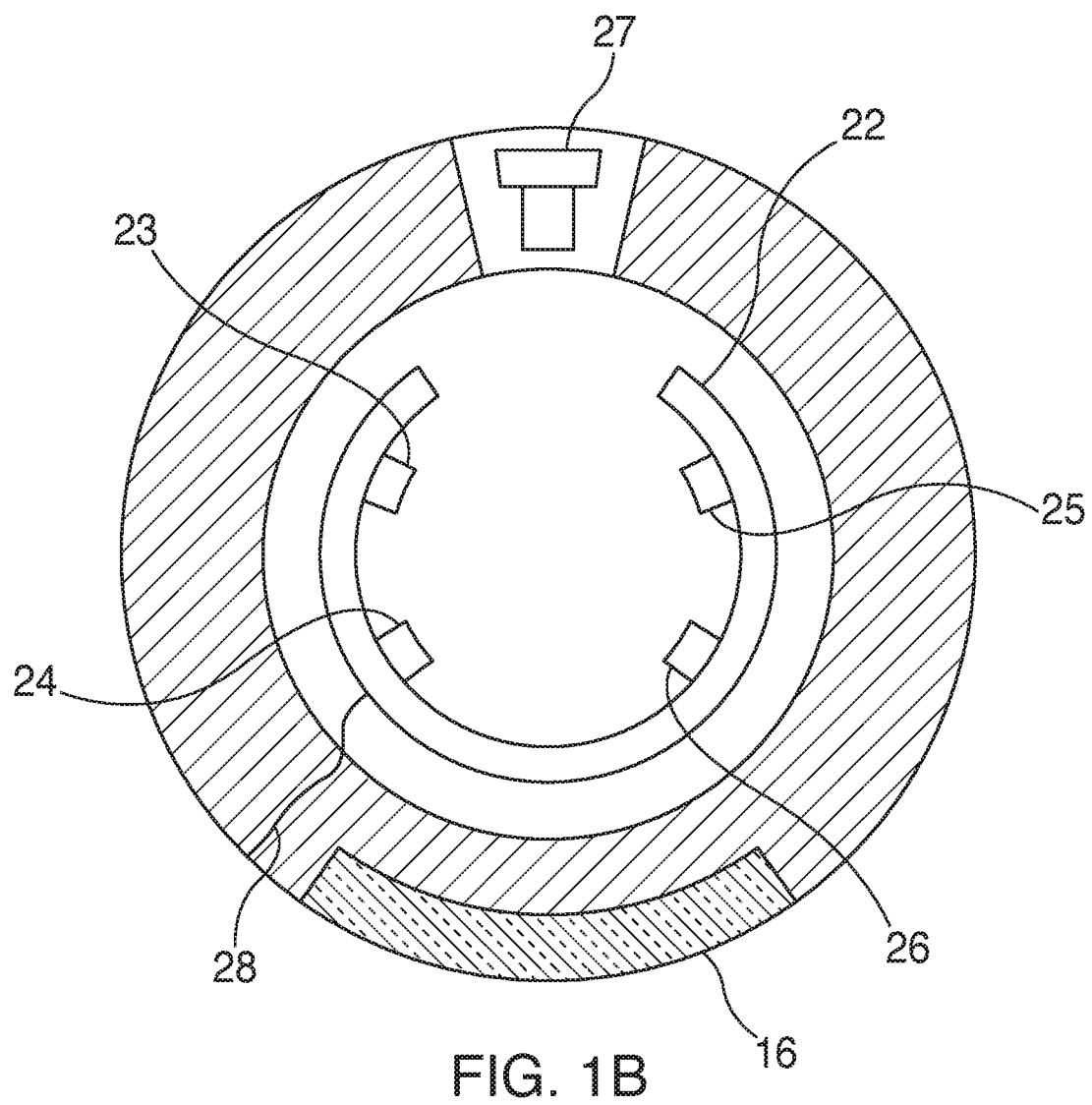

FIG. 1B shows a cross section of the handle 2 in the area 14 accommodating the means 15. This area of the handle contains a flexible PCB 22, which can include the digital data memory storage for internally storing audio signals, an AM receiver 23, an FM receiver 24, an AM transmitter 25, an FM transmitter 26, a speaker 27. Corresponding lead wires are identified with reference numerals 28. A user of the device 1a in correspondence with this embodiment of the present invention, in addition to supporting a smartphone with a video camera or supporting an action video camera and adjusting their orientation and providing smooth stable movement video recording, can operate the above identified elements of the means 15 so as to receive the audio signals from the signal source via the receivers receivers 23 and 24, transmit the received audio signals via the transmitters 25 and 26, and optimally reproduce in the vicinity of the smartphone having a video camera or action video camera supported by the device 1a the audio signals via the speaker 27 positioned in the handle 2 below the holder 3.

Figure 1C:
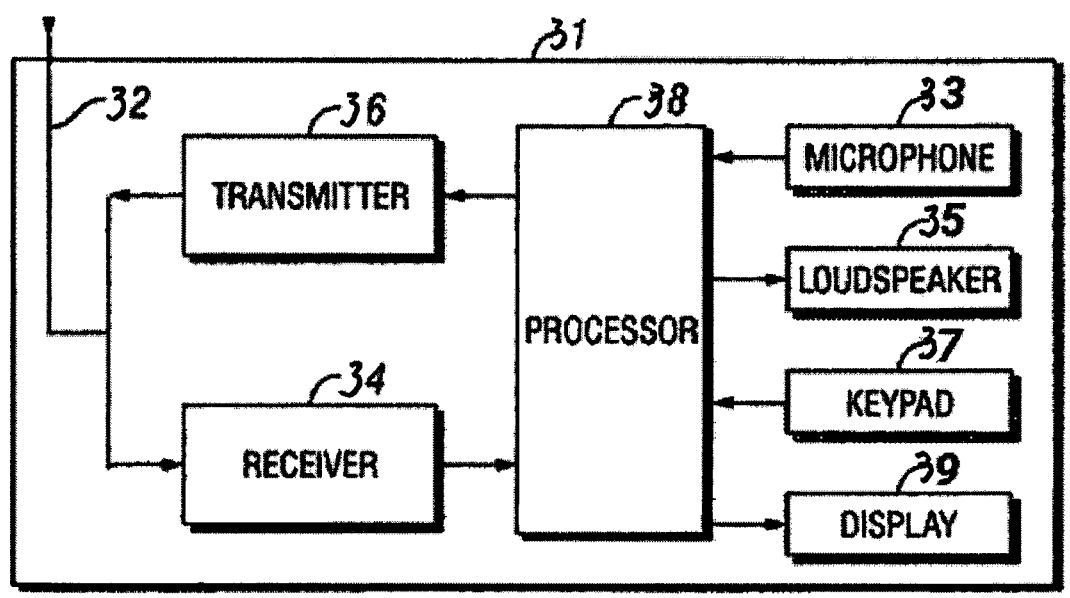

FIG. 1C of the drawings shows a schematic block diagram of the device in accordance with the present invention. The device is identified as a whole with reference numeral 31 and has an antenna 32 which is used for transmitting and receiving radio signals. The received signals are passed to a receiver circuitry 34, while the transmitted signals are sent to the antenna 32 from a transmitter circuitry 36. The receiver circuitry 34 and the transmitter circuitry 36 are both connected to a processor circuitry 38 which, in this case, is used to represent both a signal processing circuitry and a control processor which controls the operation of the device. The processor circuitry 38 can receive audio inputs from a microphone 33, and an alphanumeric or other inputs from a keypad 37, and provide audio outputs through a loudspeaker 35 and visual outputs through a display 39.

Figure 1D:
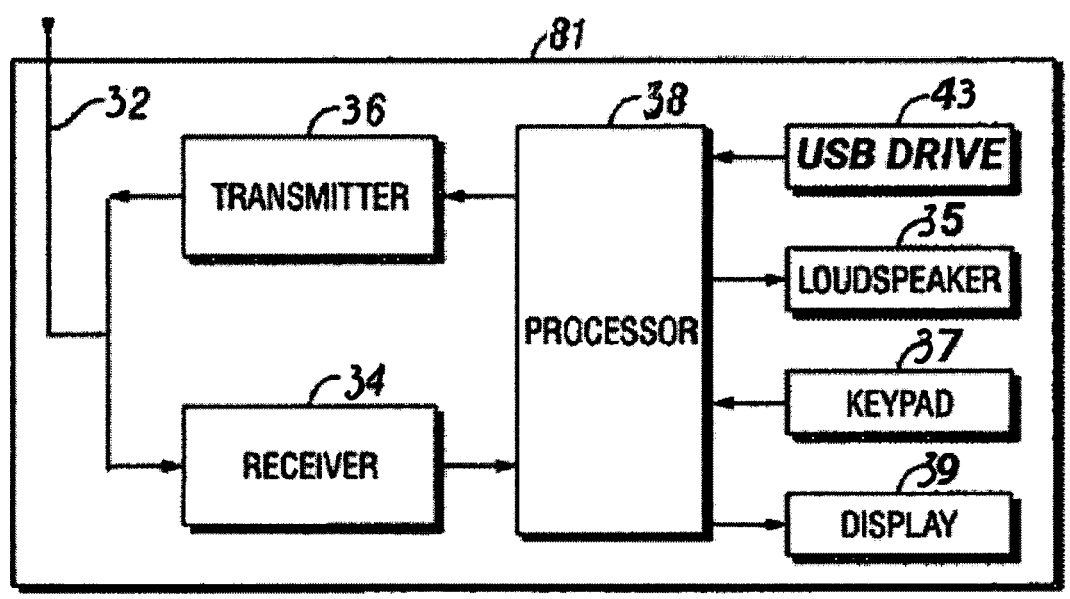

FIG. 1D of the drawings shows a schematic block diagram of the device for supporting a smartphone having a video camera or supporting an action video camera in accordance with another aspect of the present invention. In particular it shows a portable communication apparatus in which the present invention can be applied. The device is identified as a whole with reference numeral 81 and has an antenna 32 which is used for transmitting and receiving audio signals. The received signals are passed to a receiver circuitry 34, while the transmitted signals are sent to the antenna 32 from a transmitter circuitry 36. The receiver circuitry 34 and the transmitter circuitry 36 are both connected to a processor circuitry 38 which, in this case, is used to represent both a signal processing circuitry and a control processor which controls the operation of the device. The processor circuitry 38 can receive audio inputs from a USB flash drive 43 for inserting USB flash drive with a digital mp3 music files playlist, and an alphanumeric or other inputs from a keypad 37, and provide audio outputs through a loudspeaker 35 and visual outputs through a display 39.

Figure 2:
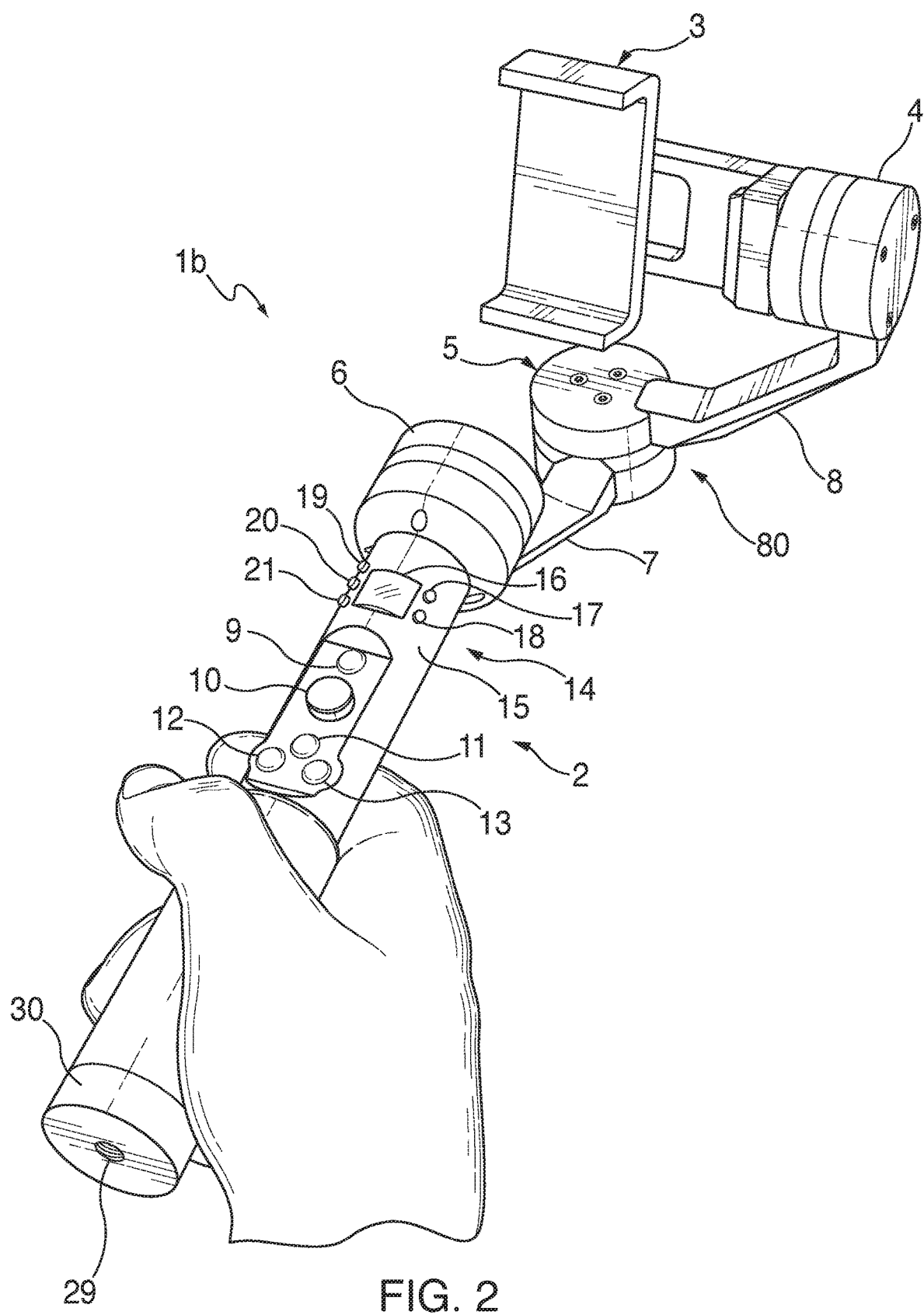

FIG. 2 of the drawings shows the device for supporting a smartphone having a video camera or supporting an action video camera in accordance with further features of the present invention. It includes the components shown in FIGS. 1A and 1B and at the same time it has additional novel features. In the device shown in FIG. 2 the handle 2 in its end which is opposite to the holder 3 is provided with an opening 29 for attaching the device to a not shown support, such as a monopod, a tripod or the like. The opening 29 can be provided with an inner thread for screwing in a corresponding threaded end of such a support. The opening 29 can be provided in a part 30 connectable with a remaining part of the handle 2, for example also by a threaded connection.

Figure 3:
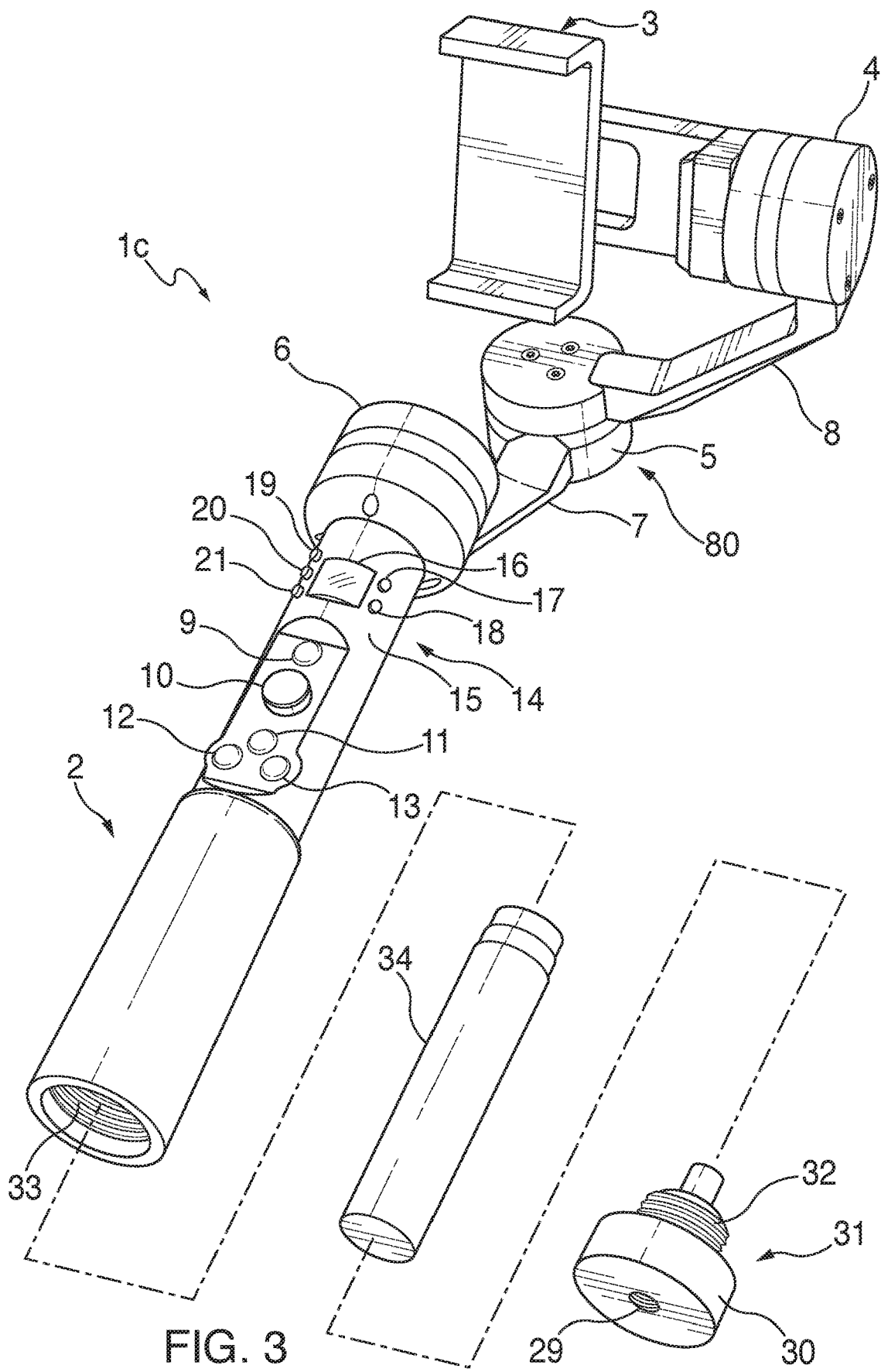

FIG. 3 of the drawings shows the device for supporting a smartphone with a video camera or supporting an action video camera in accordance with further features of the present invention. It includes the components shown in FIGS. 1A, 1B and 2 and at the same time it has additional novel features. In the device shown in FIG. 3 the part 30 which has a threaded portion 31 is provided with an outer thread 32. It can be screwed into the lower part of the handle 2 which is hollow and provided with an inner thread 33. When the part 30 is unscrewed and removed from a remaining part of the handle 2, an inner opening in the handle is exposed and a replaceable battery 34 can be inserted into the hollow handle, with the subsequent threaded connection of the part 30 to the remaining part of the handle 2 to close the inner opening. While FIG. 3 shows that the device for supporting a smartphone with a video camera or supporting an action video camera of the invention is battery operated, and possibly with the rechargeable battery, the device can be designed so that it can be rechargeable from an outside current source without any need from a battery.

Figure 4:
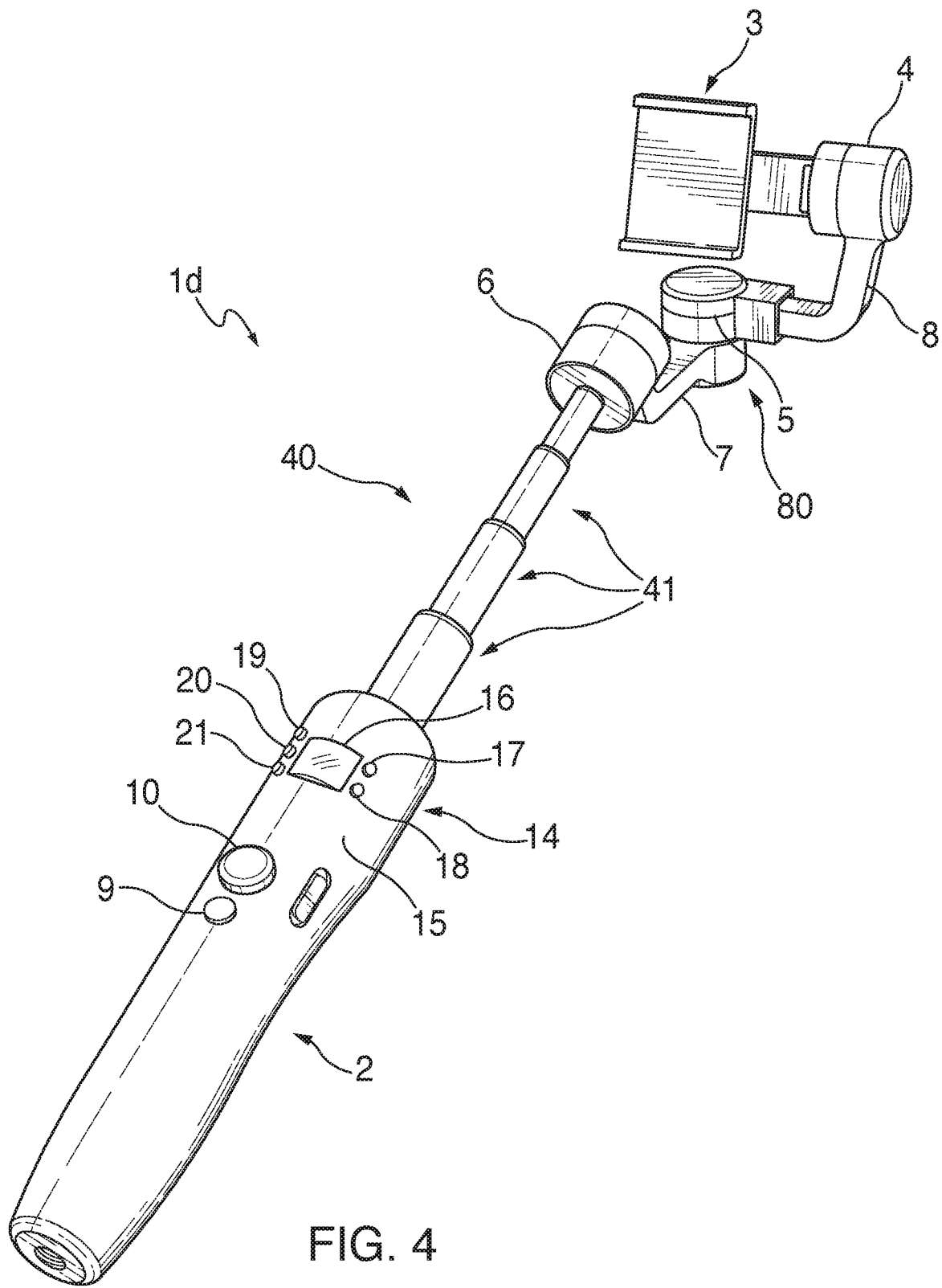

FIG. 4 of the drawings shows the device for supporting a smartphone having a video camera or supporting an action video camera in accordance with a further feature of the present invention. It includes the components shown in FIGS. 1A and 1B and at the same time it has additional novel features. In the device shown in FIG. 4 the handle 2 is connected with remaining components of the device via a multi-part telescoping connecting unit 40 composed of a plurality of handle elements 41 which are telescoping connectable with one another and are displaceable relative to one another. More particularly, while one end of the telescoping connecting unit 40 is connected with the handle 2, its opposite end is connected with the pan axis motor 6. As a result, by extending or retracting of the telescoping connecting unit 40 a distance of the holder 3 holding a not shown smartphone with a video camera or with an action video camera from the handle 2 can be reduced or increased depending on a user's preference.

Figure 5:
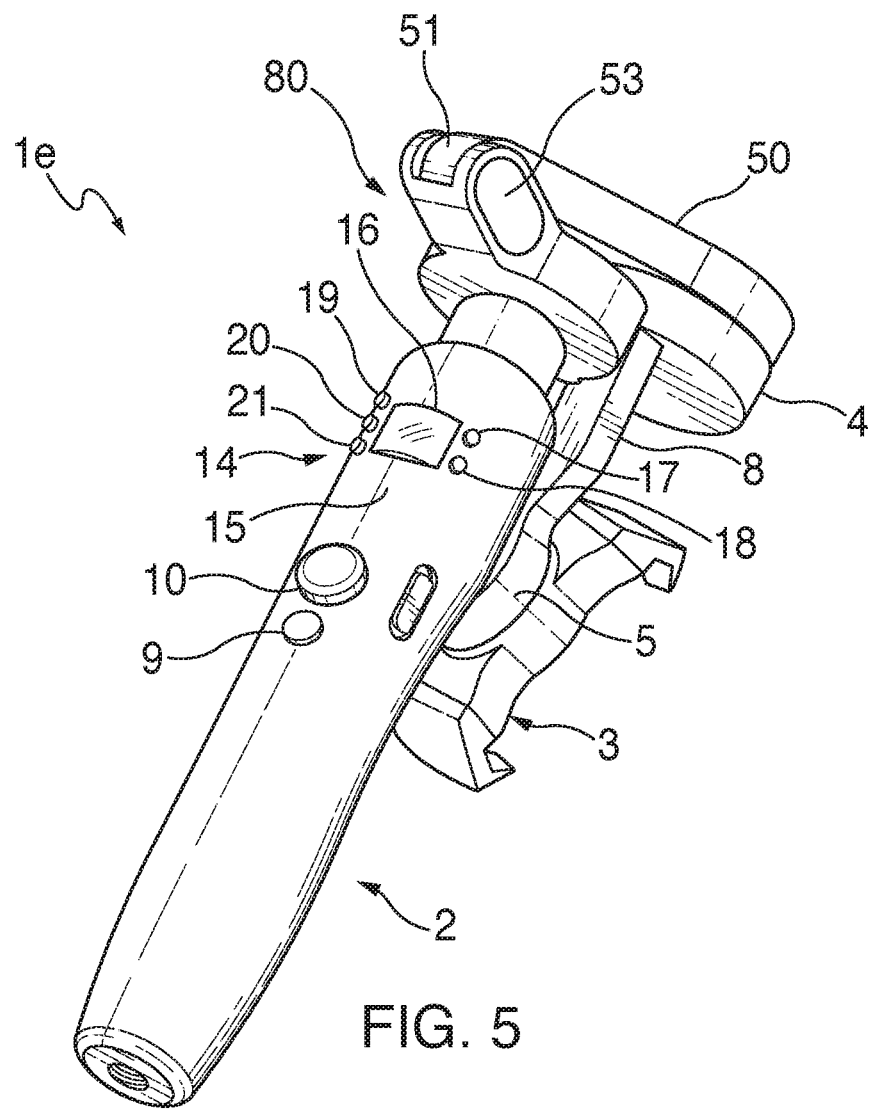
Figure 6:
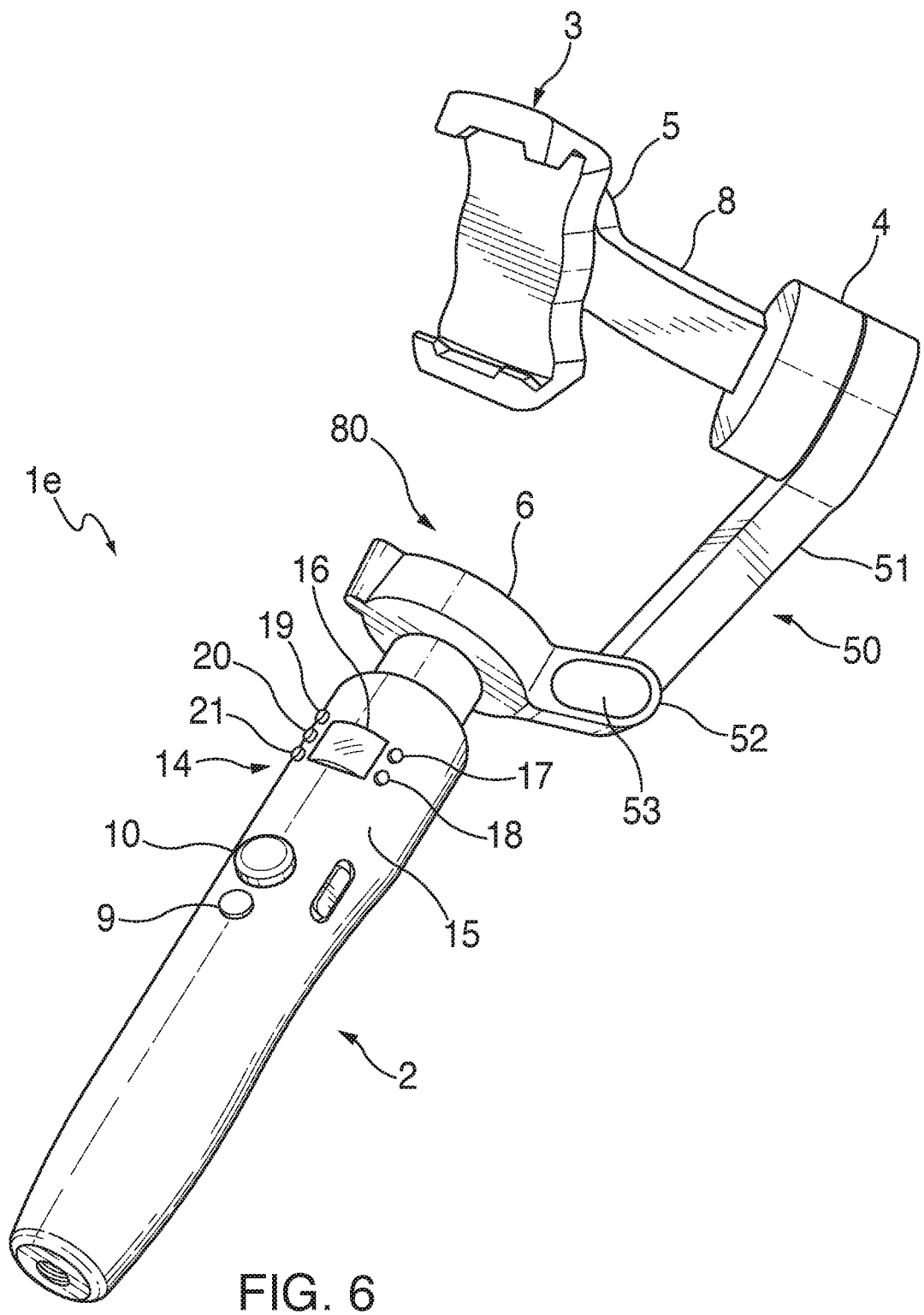

FIGS. 5 and 6 of the drawings show the device for supporting a smartphone having a video camera or supporting an action video camera in accordance with a further feature of the present invention. It includes the components shown in FIGS. 1A and 1B and at the same time has additional novel features. In the device shown in FIGS. 5 and 6 a foldable arm 50 is provided. The foldable arm 50 has one end 51 connected with the tilt axis motor 4 and another opposite end 52 which is pivotable and connected with the pan axis motor 5, with covers 53 covering opposite axial ends of the pivotal connection. As shown in this figure, the device can be folded so as to occupy a substantially small space, which can be convenient for its storage and transportation.

Figure 7:
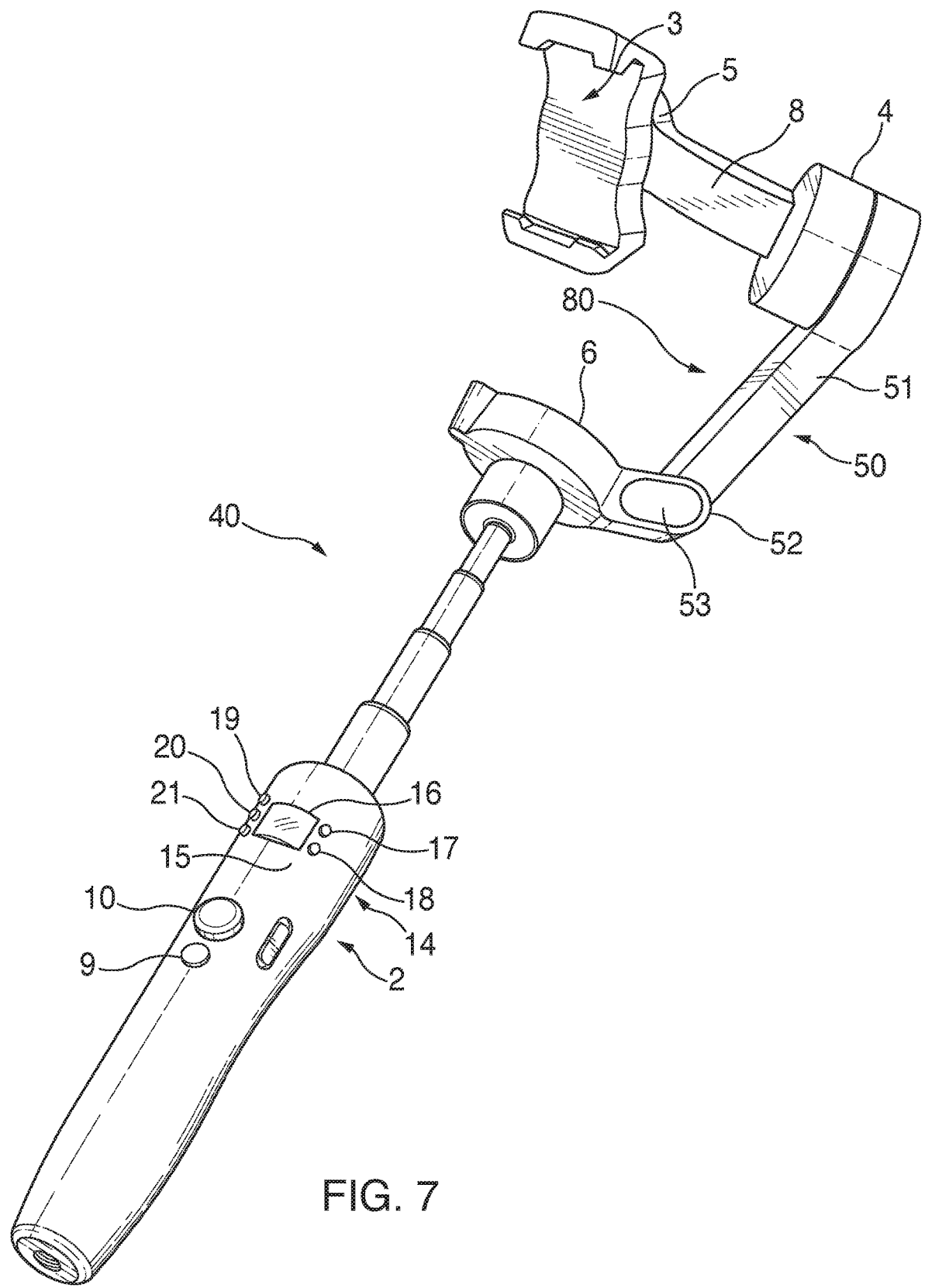

FIG. 7 of the drawings shows the device for supporting a smartphone having a video camera or supporting an action video camera in accordance with a further feature of the present invention. The supporting device 1*f* has a handle 2 adapted to be held by a user and connected with a holder 3 for receiving and holding a not shown smartphone with a video camera or holding an action video camera. It further has a tilt axis motor 4, a roll axis motor 5, and pan axis motor 6 for imparting corresponding movements to the holder 3 and thereby to a smartphone with the video camera or to an action video camera held in the holder 3. A multi-part telescoping connecting unit 40 is provided and composed of a plurality of handle elements 41 that are telescopingly connectable with one another and are displaceable relative to one another connects the handle 2 with the pan or yaw motor 6. As a result, by extending or retracting the telescoping connecting unit 40 the distance of the holder 3, and thereby of a not shown smartphone with a video camera or of an action video camera received in it from the handle 2 can be reduced or increased depending on a user's preference. A foldable arm 50 is further provided and has one end 51 connected with the tilt axis motor 4 and another opposite end 52 which is pivotable connected with the pan axis motor 6, with covers 53 covering opposite axial ends of the pivotal connection. As a result, the device can be folded so as to occupy a substantially small space, which can be convenient for its storage and transportation.

Figure 8:
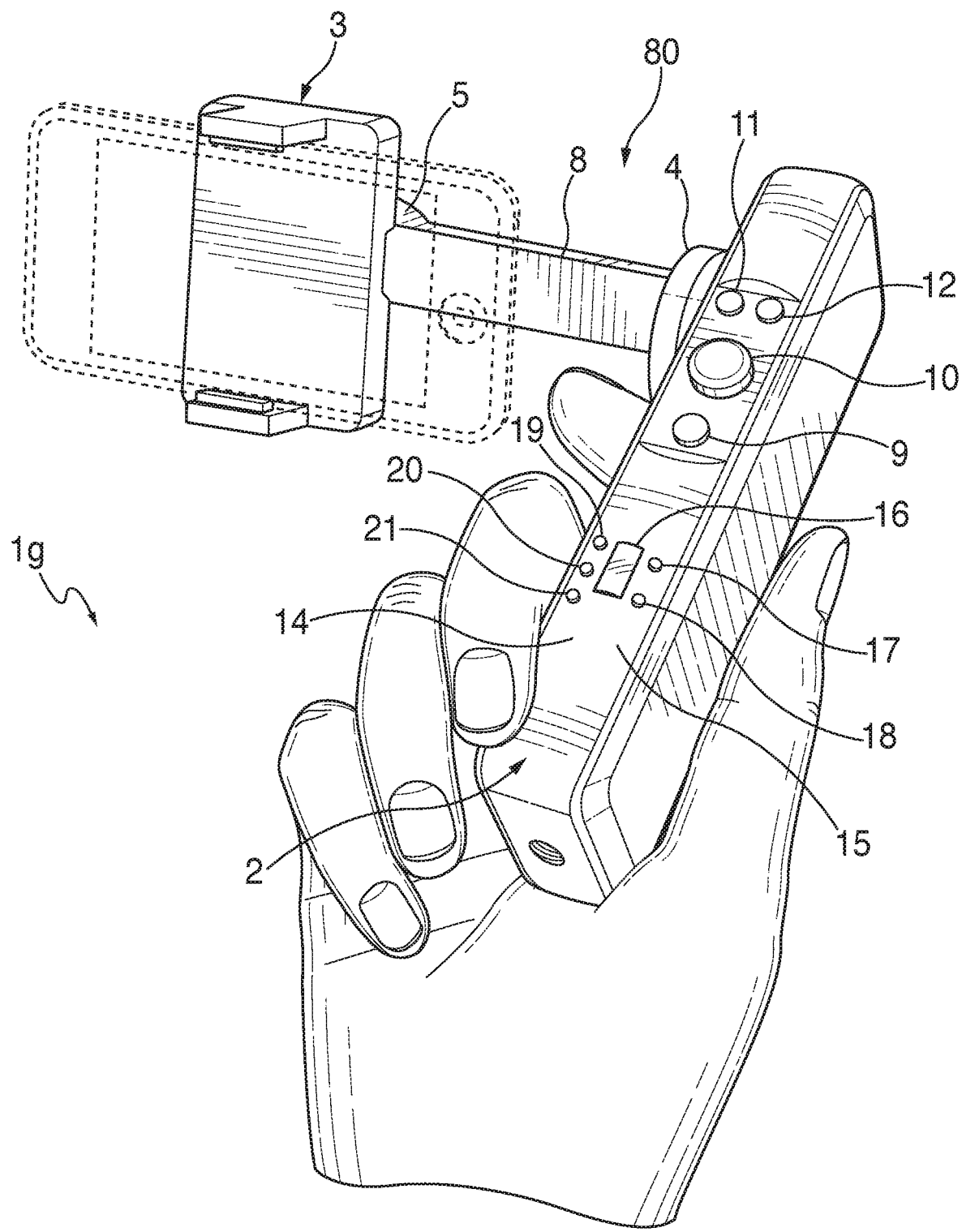

FIG. 8 of the drawings shows the device for supporting a smartphone having a video camera or supporting an action video camera in accordance with a further feature of the present invention. The supporting device 1*g* has a handle 2 adapted to be held by a user and connected with a holder 3 for receiving and holding a not shown smartphone with a video camera or an action video camera. It further has a roll axis motor 5 and a tilt axis motor 4 for imparting corresponding movements to the holder 3 and thereby to a smartphone with a video camera or to an action video camera held in the holder 3. The handle 2 in the embodiment has a substantially rectangular cross section. Similarly to the embodiment of FIGS. 1A and 1B, it has an additional portion which is identified with reference numeral 14 and provided with components 15 which allow receiving audio signals from audio sources and reproducing them in the vicinity of the device and therefore in the vicinity of a supported smartphone with the video camera or of the supported action video camera during recording by the video camera so that the video recording includes the reproduced audio signals from the device.

Figure 9:
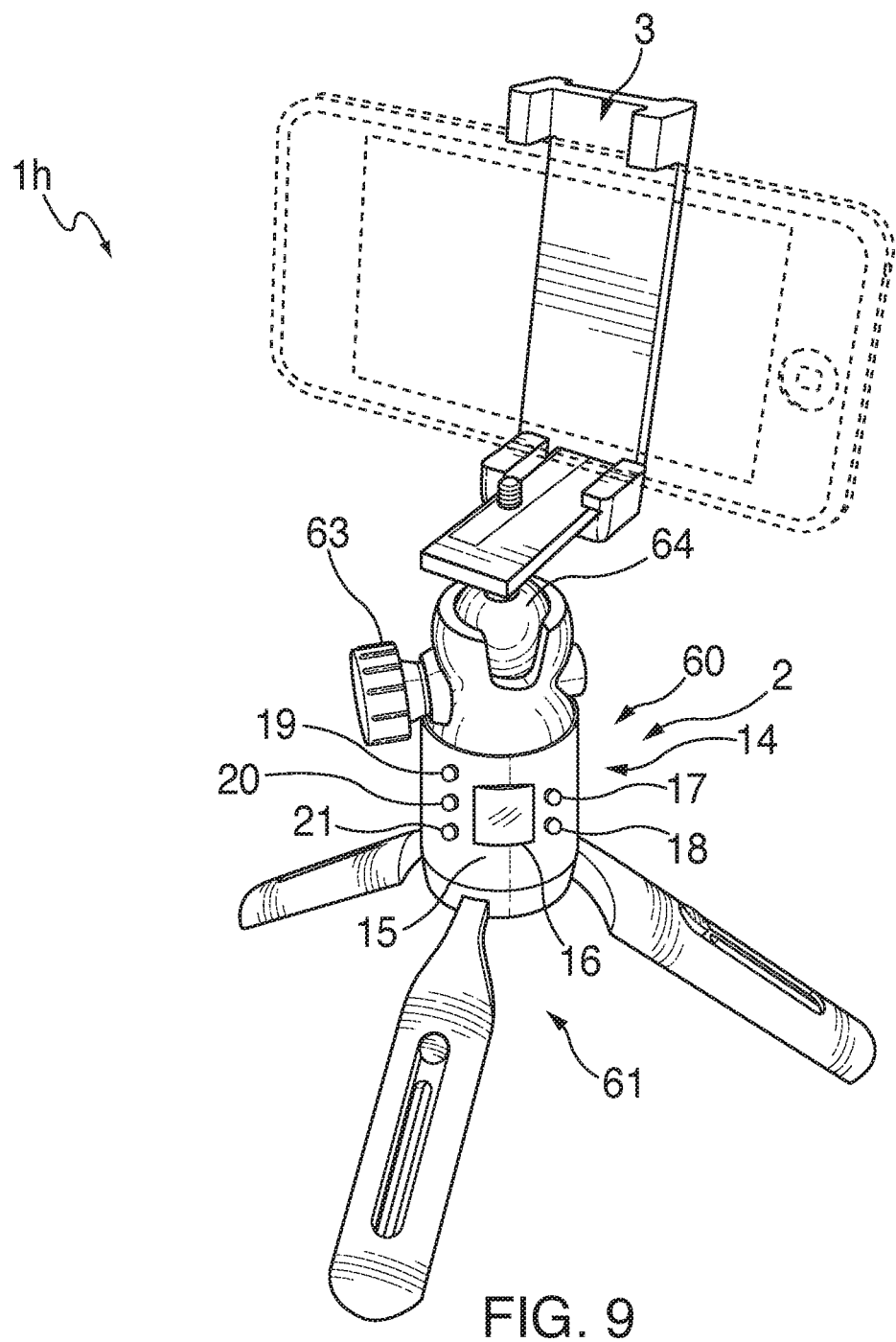

FIG. 9 of the drawings shows the device for supporting a smartphone having a camera or supporting a camera in accordance with a further feature of the present invention. The supporting device 1*h* is a small tripod that has a handle 2 adapted to be held by a user and connected with a holder 3 for receiving and holding a not shown smartphone with a video camera or an action video camera. The holder 3 includes a housing 60 that has an additional portion which is identified with reference numeral 14 and is provided with components 15 which allow receiving audio signals from audio sources and reproducing them in the vicinity of the handle of the device and therefore in the vicinity of the supported smartphone with a video camera or of a supported action video camera during recording by the video camera so that the video recording includes the reproduced audio signals from the device. The housing 60 is supported on a tripod 61 with adjustable legs 62 that allow to extend the height and reach of the device. The holder 3 is connected with the housing 60 via a ball joint 64 and fixed by a screw 63 in its desired position.

Figure 10:
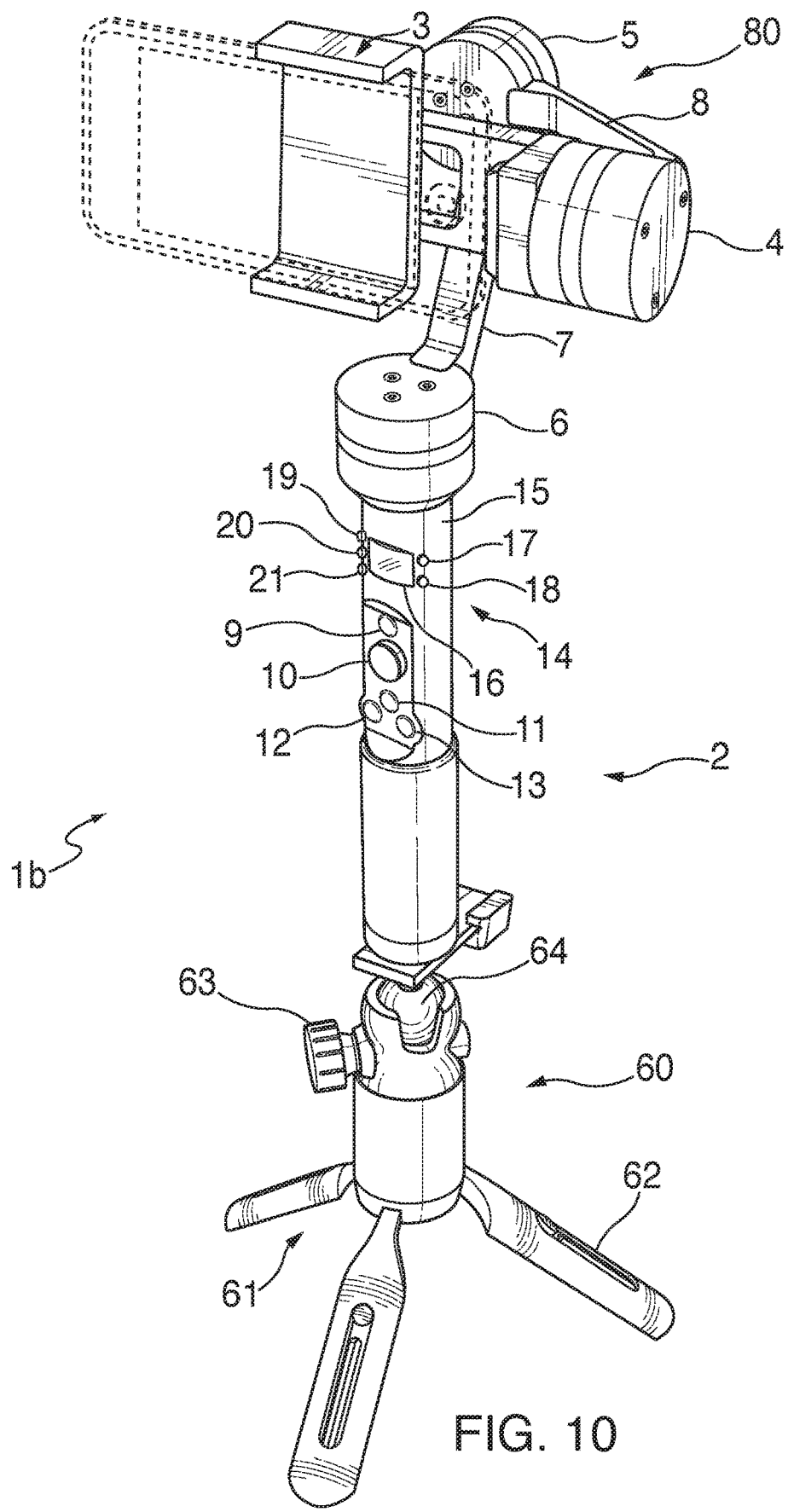

FIG. 10 of the drawings shows the device 1h of FIG. 9 for supporting a smartphone having a video camera or supporting an action video camera in accordance with a further feature of the present invention. The supporting device 1h can further support the previously shown device 1b via the insert 29. This way the device 1h can stand on a table or flat surface. Supporting device 1b has a handle 2 that is supported by the tripod 61 with adjustable legs 62. The handle 2 is connected with the housing 60 via a ball joint 64 and fixed by a screw 63 in its desired position.

Figure 11:
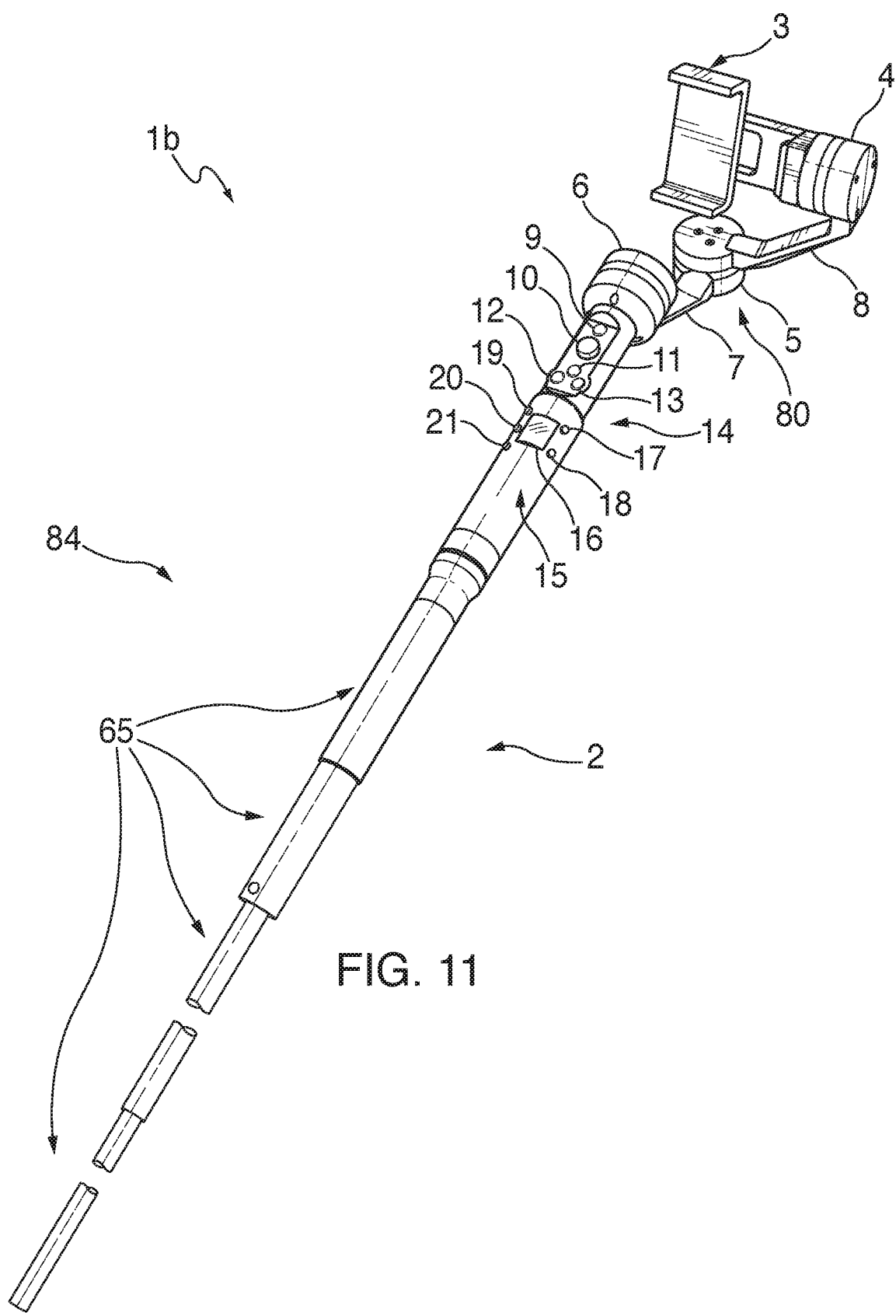

FIG. 11 of the drawings shows the device for supporting a smartphone having a video camera or supporting an action vide camera in accordance with a further feature of the present invention. The supporting device 1b has a handle 2 adapted to be held by a user and connected with a holder 3 for receiving and holding a not shown smartphone with a video camera or receiving and holding an action video camera. The handle 2 is connected with an independent external telescoping extension support pole 64 which can be held by a user and is composed of interconnected components 65 which are movable toward one another and away from one another to reduce or to increase the length of the support 64, for convenience of a user's operation with the smartphone having a video camera or with the action video camera received in the holder 3. The extension support is inserted in at the base of the supporting device 1b via the insert 29.

Figure 12:
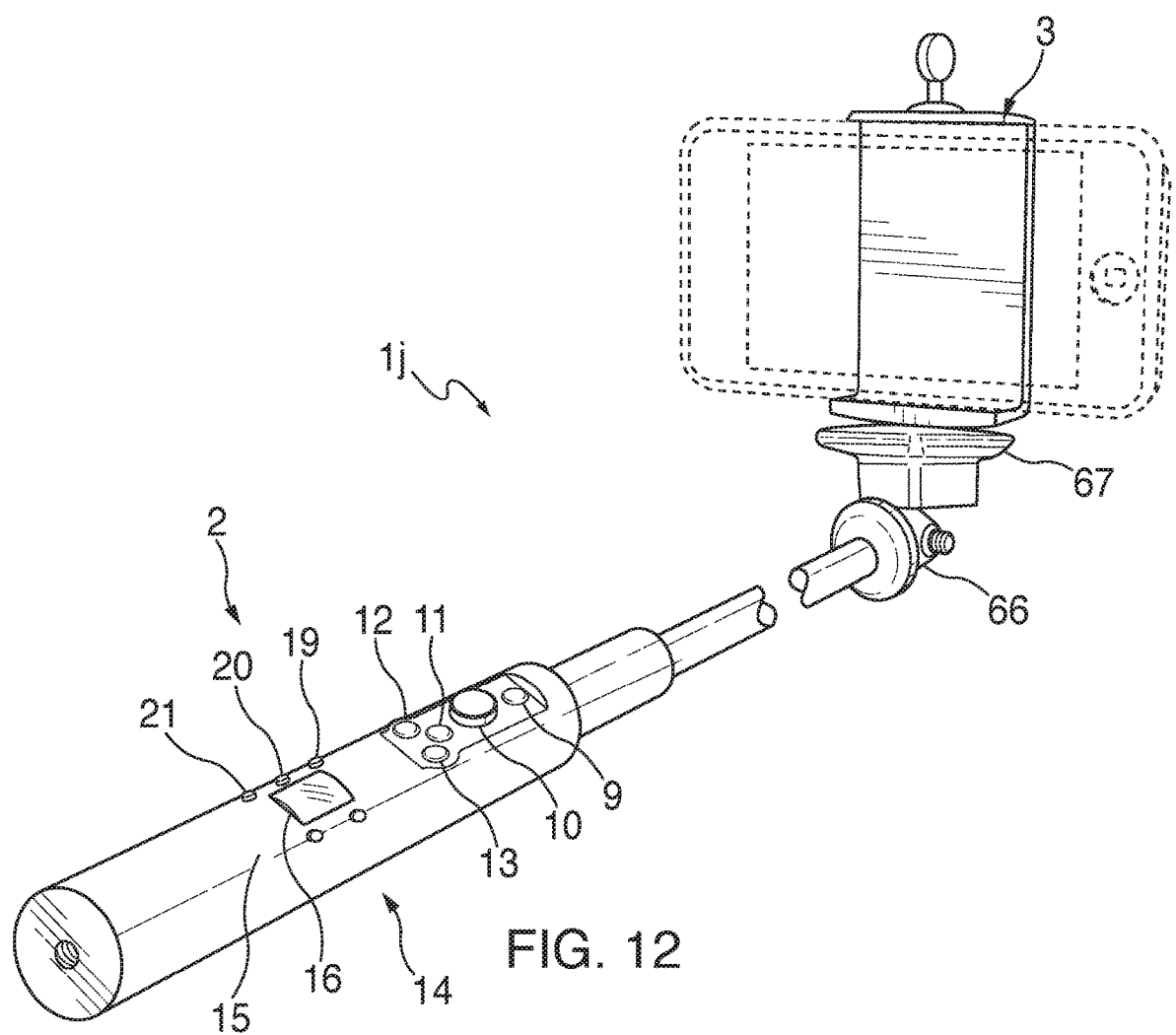

FIG. 12 of the drawings shows the device for supporting a smartphone having a video camera or supporting an action video camera in accordance with a further feature of the present invention. The supporting device 1j is a selfie stick that has a handle 2 adapted to be held by a user and connected with a holder 3 for receiving and holding a not shown smartphone with a camera or an action camera. The supporting device, similarly to the device of FIG. 1A, has an additional portion which is identified with reference numeral 14. This portion is provided with the components 15 allowing to receive audio signals from audio sources and reproducing them in the vicinity of the handle of the device and therefore in the vicinity of a supported smartphone with a camera or a supported camera during recording by the camera so that the video recording of the camera includes the reproduced audio signals from the device. The handle 2 in this embodiment is telescoping and has a plurality of individual portions telescopingly connected with each other to increase or reduce the length of the handle 2. The individual portion which is the closest to the holder 3 has an element 66 which is turnably connected with an element 67 supporting the holder 3.

Figure 13:
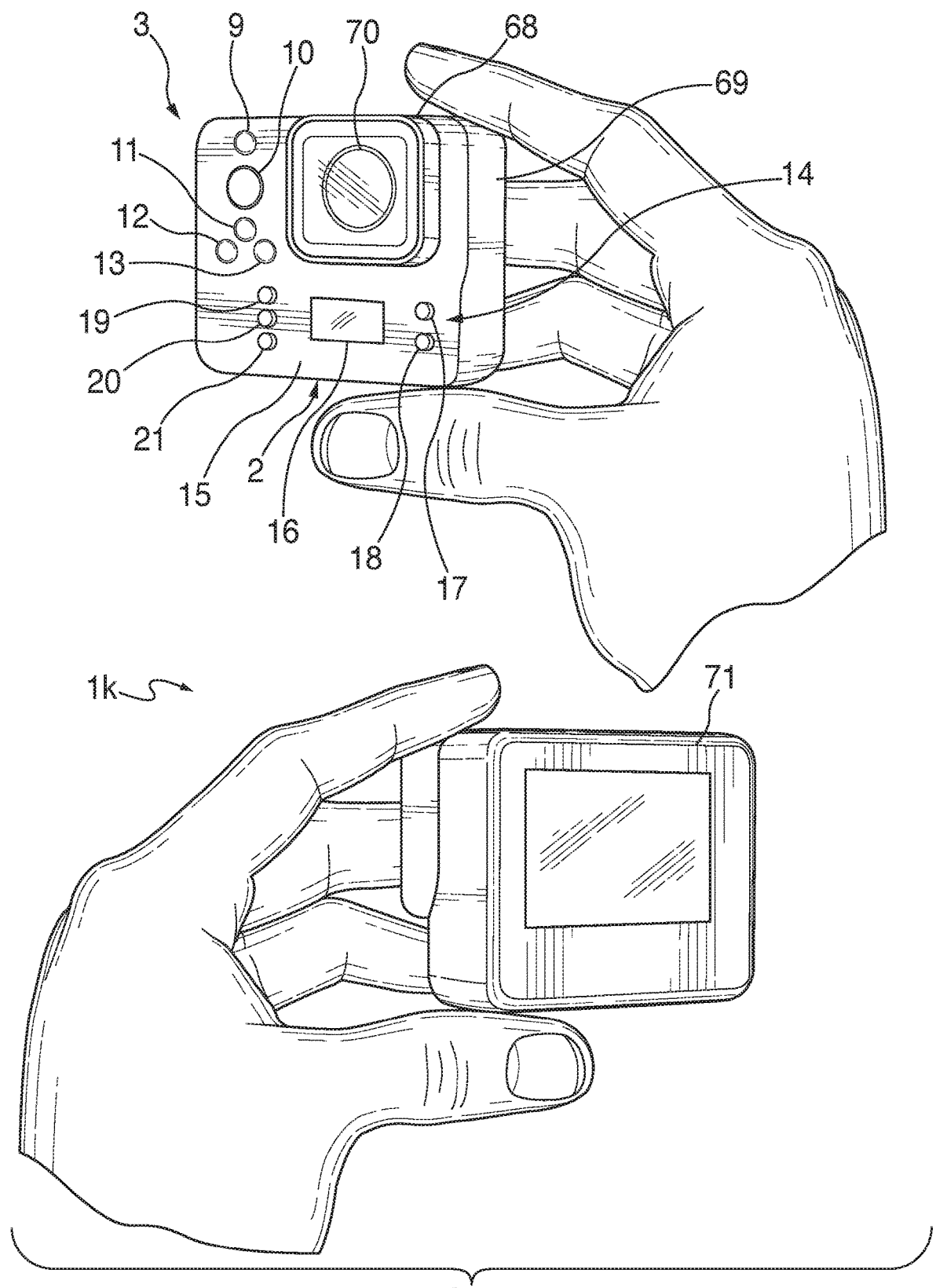

FIG. 13 of the drawings shows the device for supporting an action video camera 68 in accordance with a further feature of the present invention. The supporting device in this embodiment has a handle 2 formed as a casing 69 of the camera 68, which is shown from its front side on the right view and from its rear side on the left view. The camera 68 has a camera casing forming a holder 3, an objective 70 and a viewfinder display 71. The casing 69 of the camera 68 has a portion which is identified with reference numeral 14 and provided with the components 15 allowing receiving audio signals from audio sources and reproducing them in the vicinity of the handle of the device and thereby in the vicinity of the supported video camera during recording by the supported video camera so that the video recording of the camera includes the reproduced audio signals from the device, as in the embodiments of FIG. 1A.

Figure 14:
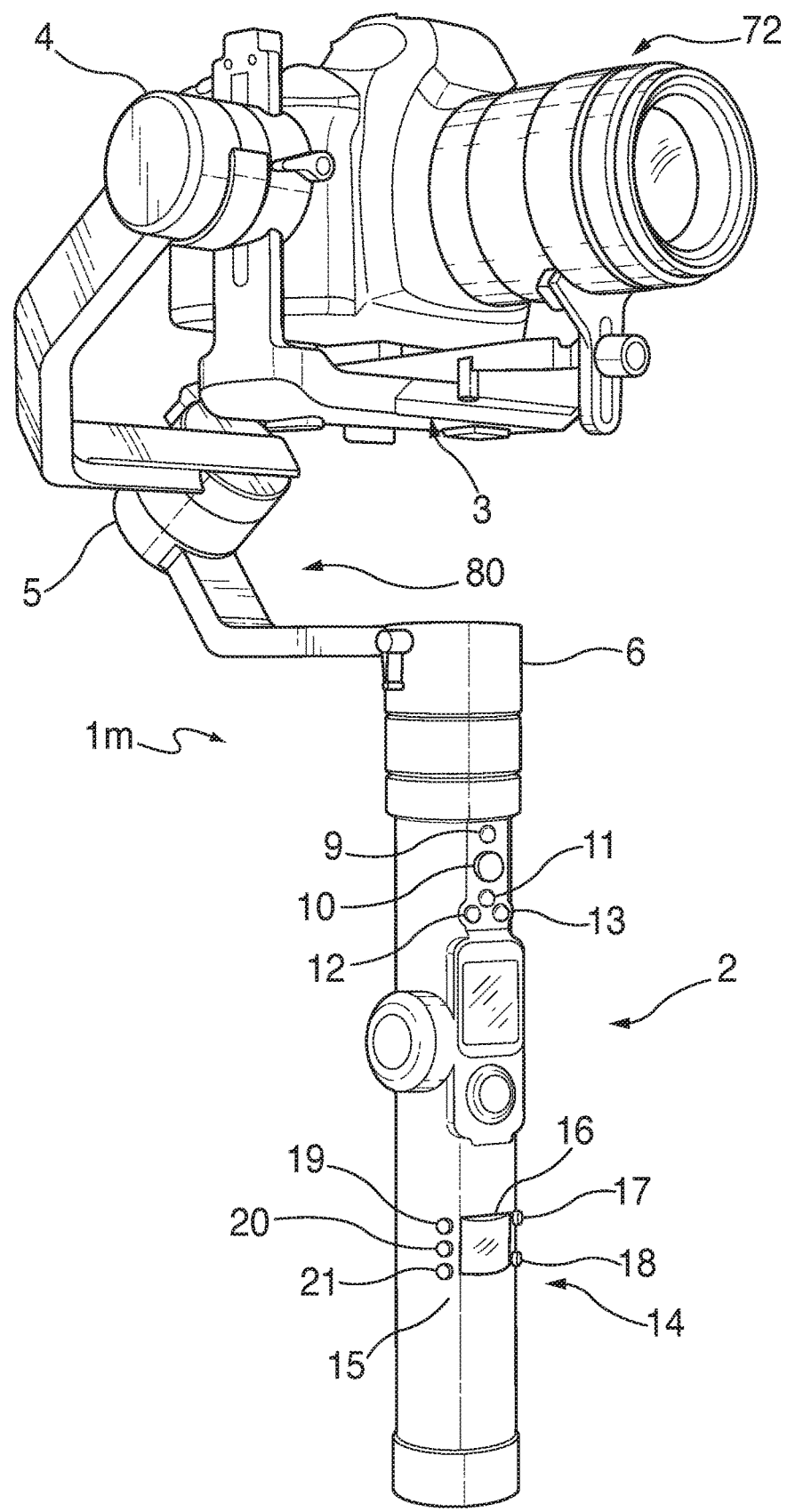

FIG. 14 shows the device for supporting a large camera 72 in accordance with a further feature of the present invention which is held in the holder 3. This device has components corresponding to the components of the device shown in FIG. 1A. In particular it has the three motors 4, 5, 6 and the holder 3. It also has the handle 2 with an additional portion which is identified with reference numeral 14 and provided with the same components 15 which allow receiving audio signals from audio sources and reproducing them in the vicinity of the device and therefore in the vicinity of the supported large camera before during recording by the supported large camera, so that the video recording of the large video camera includes the reproduced audio signals from the device.

Figure 15:
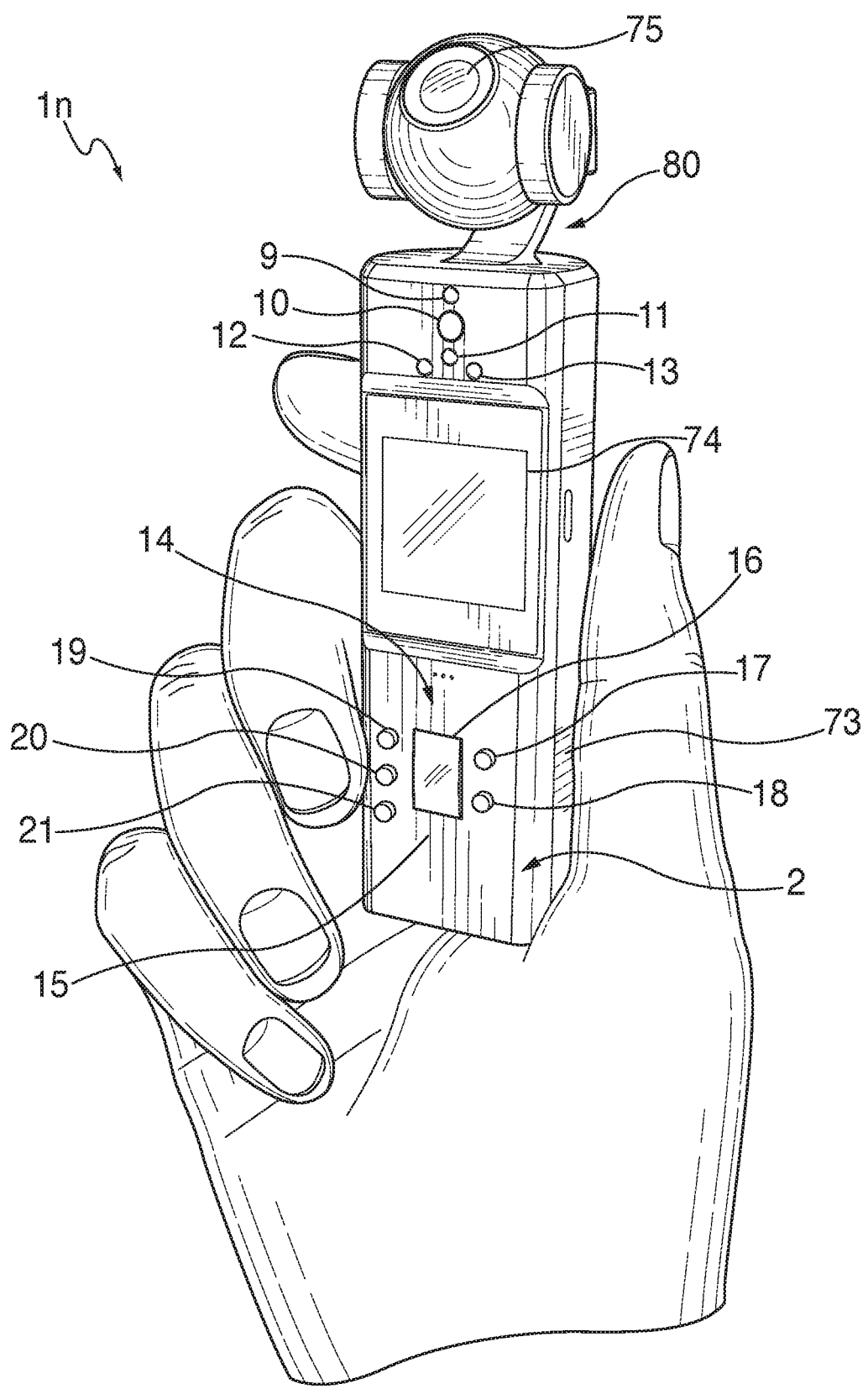
Figure 16:
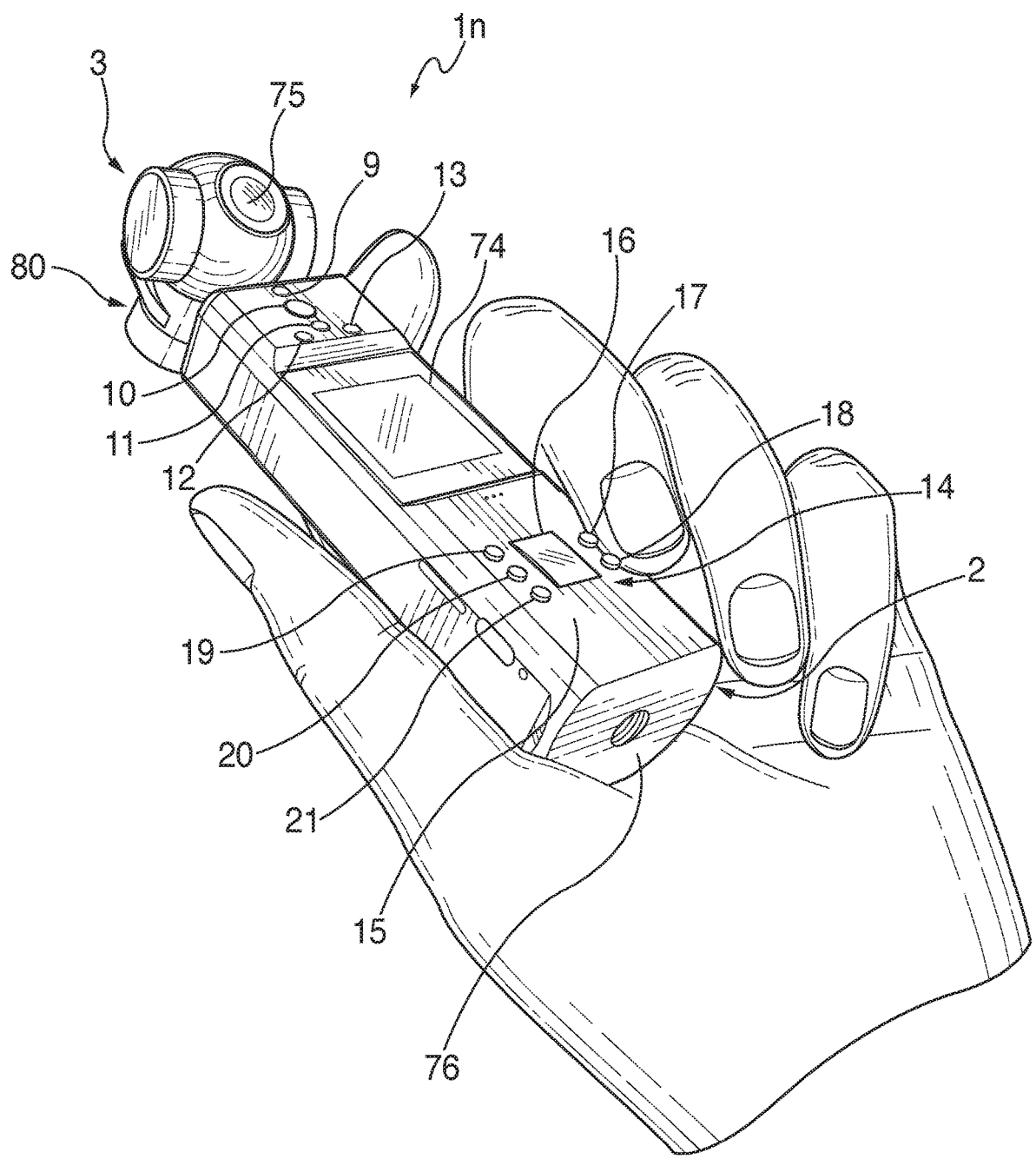

FIGS. 15 and 16 show a pocket-size device for supporting a video camera in accordance with a further feature of the present invention. The device has a casing 73 with a portion which corresponds to the handle 2 and another portion which corresponds to the holder 3. A viewfinder with a touch screen is identified with reference numeral 74 and a camera lens objective is identified with reference numeral 75. The device further has a roll axis motor 5, a tilt axis motor 4, and a pan axis motor 6 for imparting corresponding movements to the objective 75 of the camera. The supporting device has further components corresponding to the components of the device shown in FIG. 1A. In particular the casing 73 of the device has a portion which is identified with reference numeral 14 and provided with the same components 15 which allow receiving audio signals from audio sources and reproducing them in the vicinity of the handle 2 during recording by the supported camera, so that the video recording of the camera includes the reproduced audio signals from the device. The handle 2 of the device further has a lower portion with a thread 76 for connecting to a support, such as a monopod, a tripod or the like.

The present invention is not limited to the details shown since various modification and structural changes are possible without departing from the spirit of the invention.

What is desired to be protected by Letters Patent is set forth in particular in the appended claims.

The invention claimed is:

1. A device for supporting a smartphone with a video camera or an action video camera for shooting and recording a video, comprising:
   a holder for receiving and holding a smartphone with a video camera or an action camera;
   a gimbal connected with the holder and provided with motors for imparting corresponding movements to the holder and thereby to the smartphone with a video camera or the action video camera;
   a handle connected to the gimbal and controllable by a user and also provided with a speaker;
   an on/off power button provided in the handle and operative for turning on or off an operation of the motors and video recording controls on and off of the device;
   means provided in the handle for receiving audio signals from an internal audio source inside the handle and an audio speaker provided in the handle for reproducing the received audio signals in the vicinity of the handle during the video recording of the video with the supported smartphone video camera or the action video camera so that the video recording includes the reproduced audio signals from the device thereby allowing the recording of the video by the supported smartphone camera or the action video camera;

an audio signal powering up and a volume adjustment up button and an audio signal powering down and a volume adjustment down button provided in the handle for powering correspondingly up and down the audio signals reproduced in the speaker and for adjusting the volume of the received audio signals correspondingly up and down, independently from powering on and off the movement of the gimbal and thereby the movement of the grip, wherein said power button provided in the handle and operative for powering on or off the movement of the gimbal and thereby the movement of the handle, said components provided in the handle allowing to receive in the device audio signals from an outside audio source in order to reproduce these audio signals in the vicinity of the handle and the grip of the device, and an audio signal powering up and a volume adjustment up button and an audio signal powering down and a volume adjustment down button for powering correspondingly up and down the audio signals reproduced in the speaker and for adjusting the volume of the received audio signals up and down independently from powering on and off the movement of the gimbal and thereby the movement of the grip are located at one side of the holder, while said speaker provided in the handle and reproducing and the audio signals received in the device so that during video recording with the supported smartphone video camera or the action video camera the video recording can include the reproduced audio signals from the device is located at another opposite side of the handle; and additional components provided in the handle and including a joystick button for controlling a video recording and movement of the camera of the smartphone or the action camera, an orientation button for orienting the smartphone with the camera or the action camera, a button for operating corresponding modes, a button for video and photo recording, a screen display for showing wavelengths of the radio and/or video signals, a knob for switching between AM radio waves and FM radio waves, a knob for dialing a corresponding wavelength within AM and FM ranges, and a knob for adjusting a volume of the speaker which generates corresponding audio signals, wherein the joystick button for controlling a video recording and movement of the camera of the smartphone or the action camera, the orientation button for orienting the smartphone with the camera or the action camera, the button for operating corresponding modes, the button for video and photo recording, the screen display for showing wavelengths of the radio and/or video signals, the knob for switching between AM radio waves and FM radio waves, the knob for dialing a corresponding wavelength within AM and FM ranges, and the knob for adjusting a volume of the speaker are also located on the one side of the handle and spaced from each other in its longitudinal direction and in its transverse direction.

2. A device for supporting a smartphone with a video camera or an action video camera for shooting and recording a video as defined in claim 1, where said audio signal powering up and a volume adjustment up button and said audio signal powering down and a volume adjustment down button for powering correspondingly up and down the audio signals reproduced in the speaker and for adjusting the volume of the received audio signals up and down are spaced from each other in the longitudinal direction of the handle without intermediate elements between them and located at one side of the screen display as considered in the transverse direction of the handle, wherein the knob for switching between AM radio waves and FM radio waves, the knob for dialing a corresponding wavelength within AM and FM ranges, and the knob for adjusting a volume of the speaker are also spaced from each other in the longitudinal direction of the handle without intermediate elements between them and located at the opposite side of the screen display as considered in the transverse direction of the handle.

3. A device for supporting a smartphone with a video camera or an action video camera for shooting and recording a video as defined in claim 2, wherein the joystick button for controlling a video recording and movement of the camera of the smartphone or the action camera, an orientation button for orienting the smartphone with the camera or the action camera, the button for operating corresponding modes, the button for video and photo recording are located at one side of the power button provided in the handle and operative for powering on or off the movement of the gimbal and thereby the movement of the handle as considered in the longitudinal direction of the handle, while the screen display for showing wavelengths of the radio and/or video signals, and an audio signal powering up and the volume adjustment up button, the audio signal powering down and the volume adjustment down button for powering correspondingly up and down the audio signals reproduced in the speaker and for adjusting the volume of the received audio signals up and down, independently from powering on and off the movement of the gimbal and thereby the movement of the grip, the knob for switching between AM radio waves and FM radio waves, the knob for dialing a corresponding wavelength within AM and FM ranges, and the knob for adjusting a volume of the speaker for adjusting a volume of the speaker which generates corresponding audio signals are located at another opposite side of the power button provided in the handle and operative for powering on or off the movement of the gimbal and thereby the movement of the handle as considered in the longitudinal direction of the handle.

4. A device for supporting a smartphone with a video camera or an action video camera for shooting and recording a video as defined in claim 3, wherein the handle is hollow, wherein as considered in a transverse cross section of the handle the speaker and the screen display are located at opposite transverse sides of the handle as considered in a first transverse direction of the handle; and further comprising an AM receiver, an FM receiver, an AM transmitter and an FM transmitter located inside the hollow handle so that as seen in a second transverse direction with is circumferentially offset from the first transverse direction the AM receiver and the FM receiver are located at one side of the handle while the AM transmitter and the FM transmitter and located at an opposite side of the handle as considered in the second transverse direction of the handle.

* * * * *